(12) United States Patent
Kwon et al.

(10) Patent No.: US 11,592,155 B2
(45) Date of Patent: Feb. 28, 2023

(54) LIGHT-EMITTING DEVICES, HEADLAMPS FOR VEHICLES, AND VEHICLES INCLUDING THE SAME

(71) Applicant: Samsung Electronics Co., Ltd., Suwon-si (KR)

(72) Inventors: Yong-min Kwon, Seoul (KR); Pun-jae Choi, Yongin-si (KR); Geun-woo Ko, Yongin-si (KR); Jong-hyun Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/373,038

(22) Filed: Jul. 12, 2021

(65) Prior Publication Data

US 2021/0341125 A1    Nov. 4, 2021

Related U.S. Application Data

(63) Continuation of application No. 16/454,852, filed on Jun. 27, 2019, now Pat. No. 11,060,689.

(30) Foreign Application Priority Data

Jul. 18, 2018    (KR) .................. 10-2018-0083649

(51) Int. Cl.
*H01L 33/50*    (2010.01)
*H01L 25/075*    (2006.01)
*H01L 33/02*    (2010.01)
*F21S 41/657*    (2018.01)
(Continued)

(52) U.S. Cl.
CPC ............ *F21S 41/657* (2018.01); *B60Q 1/045* (2013.01); *F21S 41/141* (2018.01); *H01L 25/0753* (2013.01); *H01L 33/507* (2013.01); *H01L 33/508* (2013.01); *H01L 33/02* (2013.01); *H01L 33/50* (2013.01)

(58) Field of Classification Search
CPC combination set(s) only.
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |

(Continued)

FOREIGN PATENT DOCUMENTS

| | | |
|---|---|---|
| JP | 2002-245812 A | 8/2002 |
| JP | 2014-082236 A | 5/2014 |

(Continued)

*Primary Examiner* — Renan Luque
(74) *Attorney, Agent, or Firm* — Harness, Dickey & Pierce, P.L.C.

(57) ABSTRACT

A light-emitting device includes an emission array including a plurality of light-emitting elements and a partition wall. The emission array includes a first region and a second region adjacent to each other. The partition wall is configured to isolate the first region and the second region from each other, such that the partition wall at least partially defines the first region in the emission array. The first region is associated with a first emission factor and the second region is associated with a second emission factor, the second emission factor different from the first emission factor.

20 Claims, 21 Drawing Sheets

(51) Int. Cl.
 *F21S 41/141* (2018.01)
 *B60Q 1/04* (2006.01)

(56) References Cited

U.S. PATENT DOCUMENTS

| | | | |
|---|---|---|---|
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,704,762 B2 | 4/2010 | Jeganathan et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,914 B2 | 5/2014 | Agatani et al. |
| 8,735,931 B2 | 5/2014 | Han et al. |
| 8,766,295 B2 | 7/2014 | Kim |
| 9,332,599 B2 | 5/2016 | Kasakura et al. |
| 9,704,833 B2 * | 7/2017 | Kong ................. H01L 27/153 |
| 2010/0025700 A1 | 2/2010 | Jung et al. |
| 2012/0087108 A1 * | 4/2012 | Ke ..................... H01L 25/0753 |
| | | | 257/E33.012 |
| 2013/0334553 A1 | 12/2013 | Yeh et al. |
| 2014/0175978 A1 | 6/2014 | Kobayashi |
| 2014/0197431 A1 | 7/2014 | Oka |
| 2016/0181483 A1 | 6/2016 | Eichenberg et al. |
| 2016/0227616 A1 | 8/2016 | Lee |
| 2017/0018538 A1 | 1/2017 | Tiwari et al. |
| 2017/0167686 A1 | 6/2017 | Kang |
| 2017/0246983 A1 | 8/2017 | Canonne et al. |
| 2017/0263591 A1 | 9/2017 | Abe et al. |
| 2018/0069162 A1 | 3/2018 | Abe et al. |
| 2018/0073704 A1 | 3/2018 | Hierzer |
| 2018/0074240 A1 | 3/2018 | Bonar et al. |
| 2018/0083156 A1 | 3/2018 | Mezouari et al. |
| 2018/0254263 A1 | 9/2018 | Hamada et al. |
| 2018/0351054 A1 | 12/2018 | Chen et al. |
| 2019/0067533 A1 * | 2/2019 | Chen ................... H01L 33/508 |
| 2019/0074417 A1 | 3/2019 | Andrews et al. |
| 2019/0273179 A1 * | 9/2019 | Iguchi ................. H01L 33/62 |
| 2019/0326488 A1 | 10/2019 | Basin et al. |
| 2020/0182431 A1 | 6/2020 | Albou et al. |

FOREIGN PATENT DOCUMENTS

| | | |
|---|---|---|
| KR | 2015-0008718 A | 1/2015 |
| KR | 10-2015-0083248 A | 7/2015 |

* cited by examiner

LIGHT-EMITTING DEVICES, HEADLAMPS FOR VEHICLES, AND VEHICLES INCLUDING THE SAME

CROSS-REFERENCE TO RELATED APPLICATIONS

This application is a continuation of U.S. application Ser. No. 16/454,852, filed Jun. 27, 2019, which claims the benefit, under 35 U.S.C. § 119, of Korean Patent Application No. 10-2018-0083649, filed on Jul. 18, 2018, in the Korean Intellectual Property Office, the disclosure of each of which is incorporated herein in its entirety by reference.

BACKGROUND

The inventive concepts relate to light-emitting devices, headlamps for vehicles, and vehicles including the same, and more particularly, to light-emitting devices, headlamp for vehicles, and vehicles including the same, which are optimized according to emission regions and reduce manufacturing costs and operating energy.

A light-emitting device may include a plurality of light-emitting elements, various light-emitting elements may be configured to perform various, respective functions to fulfill various, respective roles or purposes.

SUMMARY

Some example embodiments of the inventive concepts provide a light-emitting device, which may be optimized according to the purposes of emission regions and reduce manufacturing costs and operating energy. The light-emitting device may be optimized so that the light-emitting elements of the light-emitting device may have improved efficiency with regard to the respective roles or purposes that the light-emitting elements are configured to fulfill.

Some example embodiments of the inventive concepts provide a headlamp for a vehicle, which may be optimized according to the purposes of emission regions and reduce manufacturing costs and operating energy. The headlamp may be optimized so that the light-emitting elements of the headlamp may have improved efficiency with regard to the respective roles or purposes that the light-emitting elements are configured to fulfill.

Some example embodiments of the inventive concepts provide a vehicle, which may be optimized according to the purposes of emission regions and reduce manufacturing costs and operating energy. The vehicle may be optimized so that the light-emitting elements of the vehicle may have improved efficiency with regard to the respective roles or purposes that the light-emitting elements are configured to fulfill.

According to some aspects of the inventive concepts, a light-emitting device may include an emission array and a partition wall. The emission array may include a plurality of light-emitting elements. The emission array may include a first region and a second region. The first region and the second region may be adjacent to each other. The partition wall may be configured to isolate the first region and the second region from each other, such that the partition wall at least partially defines the first region in the emission array. The first region may be associated with a first emission factor and the second region may be associated with a second emission factor. The second emission factor may be different from the first emission factor.

According to some aspects of the inventive concepts, a headlamp for a vehicle may include a light-emitting device. The light-emitting device may include a plurality of light-emitting elements and a plurality of emission regions isolated from each other by one or more partition walls. At least two emission regions of the plurality of emission regions are associated with different emission factors.

According to some aspects of the inventive concepts, there is provided a headlamp for a vehicle, which includes a light-emitting device. The light-emitting device includes a plurality of light-emitting elements and a plurality of emission regions divided from each other by partition walls. At least two of the plurality of emission regions are different from each other in terms of emission factors.

According to some aspects of the inventive concepts, a light-emitting device may include an emission array, a partition wall, and a fluorescent layer. The emission array may include a plurality of light-emitting elements. The emission array may include a first region and a second region. The first region may include a first light-emitting element. The second region may include a second light-emitting element. The first region and the second region may be adjacent to each other. The partition wall may surround the first region and the second region. The fluorescent layer may be in an open enclosure at least partially defined by the partition wall and the first and second light-emitting elements, such that a first portion of the fluorescent layer is in the first region and a second portion of the fluorescent layer is in the second region. The first region may be associated with a first emission factor and the second region may be associated with a second emission factor, the second emission factor different from the first emission factor.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF EXAMPLE EMBODIMENTS

Figure 1:
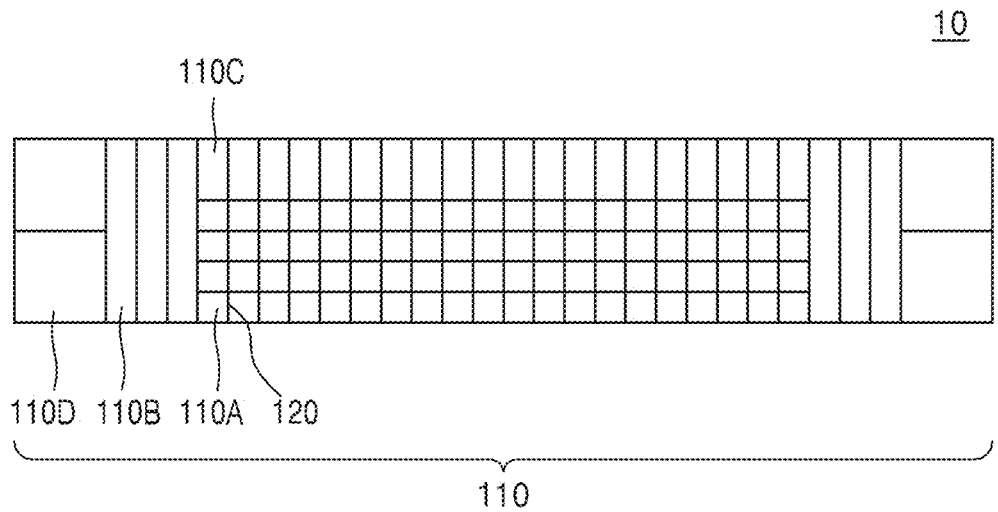
FIG. 1 is a plan view of a light-emitting device according to some example embodiments.

FIG. 1 is a plan view of a light-emitting device 10 according to some example embodiments. In some example embodiments, the light-emitting device 10 may be a head-lamp for a vehicle, as described further herein.

Referring to FIG. 1, the light-emitting device 10 may include an emission region 110, also referred to herein interchangeably as an "emission array." As shown in FIG. 1, the emission region 110 of the light-emitting device 10 may include a first region 110A and a second region 110B. As further shown in FIG. 1, the emission region 110 of the light-emitting device 10 may further include a third region 110C and a fourth region 110D.

As shown in at least FIG. 1, the first and second regions 110A, 110B may be adjacent to each other. As shown in FIG. 1, in some example embodiments, the first and third regions 110A, 110C may be adjacent to each other. As shown in FIG. 1, in some example embodiments, second first and third regions 110B, 110C may be adjacent to each other. As shown in FIG. 1, in some example embodiments, the second and fourth regions 110B, 110D may be adjacent to each other. The first to fourth regions 110A, 110B, 110C, and 110D may be divided from each other by partition walls 120. Restated, the light-emitting device 10 may include one or more partition walls 120 configured to isolate one or more regions (e.g., the first region 110A) and one or more other regions (e.g., the second region 110B) from each other. The one or more partition walls 120 may surround each region of the first to fourth regions 110A, 110B, 110C, and 110D. In other words, a term 'region' may be defined as a particular (or, alternatively, predetermined) area ("portion") of the emission region 110 that is at least partially surrounded and partitioned by one or more partition walls 120 on the light-emitting device 10. Restated, in some example embodiments, one or more partition walls 120 may at least partially define one or more regions of the first through fourth regions 110A to 110D in the emission region 110. The one or more partition walls 120 may isolate a region (e.g., first region 110A) from another region (e.g., second region 110B) to at least partially define the region.

Each region of the first to fourth regions 110A, 110B, 110C, and 110D may include one light-emitting element or a plurality of light-emitting elements. In some cases, each of the first to fourth regions 110A, 110B, 110C, and 110D may be a portion of one chip or include one chip or a plurality of chips. Accordingly, it will be understood that the emission region 110 of the light-emitting device 10 may be a region of the light-emitting device 10 that includes a plurality of light-emitting elements. In some example embodiments, separate regions of the emission region 110 (e.g., the first region 110A and the second region 110B) are separate regions of a single ("common") light-emitting element.

Terms, such as "first" and "second," are used herein merely to describe a variety of constituent elements, but the constituent elements are not limited by the terms. Such terms are used only for the purpose of distinguishing one constituent element from another constituent element. For example, without departing from the right scope of the present inventive concepts, a first region may be referred to as a second region, and vice versa.

At least two of the first to fourth regions 110A, 110B, 110C, and 110D may be different from each other in terms of emission factors. An emission factor of a given region (of the first to fourth regions 110A to 110D) may be, for example, emission characteristics of light generated at the given region with application of power. For example, the emission factors may include light emission characteristics associated with light that the given region is configured to emit, such as a luminance of light emitted, a color temperature of light emitted, an orientation angle of light emitted, and contrast of light emitted. In some example embodiments, for example, the first region 110A may be associated with a first emission factor that is a light emission characteristic of light that the first region 110A is configured to emit (e.g., a luminance of light emitted by the first region 110A, a color temperature of light emitted by the first region 110A, an orientation angle of light emitted by the first region 110A, contrast of light emitted by the first region 110A, a surface shape associated with light emitted by the first region 110A, a sub-combination thereof, or a combination thereof) and the second region 110B may be associated with a second emission factor that is a light emission characteristic of light that the second region 110B is configured to emit (e.g., a luminance of light emitted by the second region 110B, a color temperature of light emitted by the second region 110B, an orientation angle of light emitted by the second region 110B, contrast of light emitted by the second region 110B, a surface shape associated with light emitted by the second region 110B, a sub-combination thereof, or a combination thereof).

Other emission factors may be, for example, power supply characteristics, such as a driving voltage, a driving current, and a driving duty, and plane shapes associated with respective regions.

Restating the above, in some example embodiments, the first to fourth regions 110A, 110B, 110C, and 110D may be associated with respective emission factors, where, for example, the first region 110A is associated with a first emission factor, the second region 110B is associated with a second emission factor, the third region 110C is associated with a third emission factor, and the fourth region 110D is associated with a fourth emission factor, and where, for example, the first emission factor is different from the second emission factor. For example, the first region 110A may be associated with a first emission factor that is a first voltage of power that the light-emitting device 10 is configured to supply to the first region 110A, and the second region 110B may be associated with a second emission factor that is a second voltage of power that the light-emitting device 10 is configured to supply to the second region, where, for example, the second voltage may be different from (e.g., greater than) the first voltage.

In some embodiments, the first to fourth regions 110A, 110B, 110C, and 110D may have different planar areas and/or volumes. In some embodiments, at least two of the first to fourth regions 110A, 110B, 110C, and 110D may have different planar areas and/or volumes. Accordingly, the first to fourth regions 110A to 110D may be associated with separate, respective emission factors, where each respective emission factor is a planar area and/or volumes of the respective region with which the respective emission factor is associated, such that, for example, the first region 110A is associated with a first emission factor that is a planar area and/or volume of the first region 110A and the second region 110B is associated with a second emission factor that is a planar area and/or volume of the second region 110B.

Figure 2:
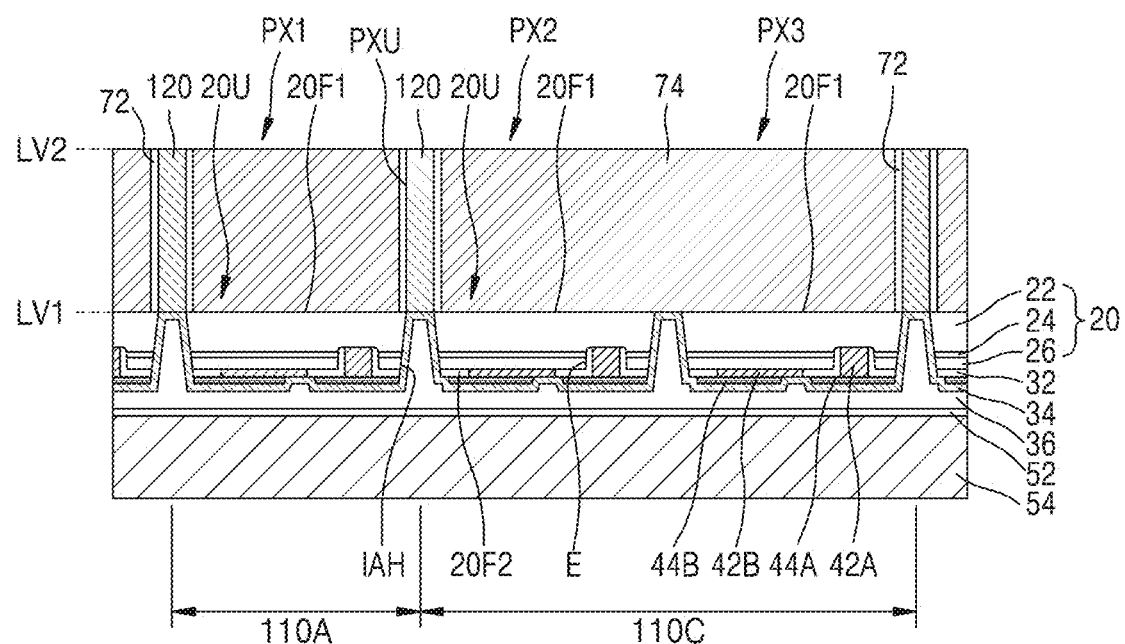
FIG. 2 is a cross-sectional view illustrating a case in which each of a first region and a third region includes one light-emitting element or a plurality of light-emitting elements, according to some example embodiments.
Figure 2:
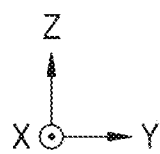

For example, in some example embodiments, the first emission factor of the first region 110A may be greater than the second emission factor of the second region 110B, such that the planar area of the first region 110A is greater than the planar area of the second region 110B, the volume of the first region 110A is greater than the volume of the second region 110B, or the planar area and the volume of the first region 110A are greater than the planar area and volume of the second region 110B, respectively. In some example embodiments, one or more regions of the first to fourth regions 110A to 110D may include a single light-emitting element. For example, as shown in FIGS. 1-2, the first region 110A may include a single light-emitting element PX1. In some example embodiments, each region of a plurality of regions (e.g., each region of the first region 110A and the second region 110B) includes a plurality of light-emitting elements.

Herein, the term "planar area" refers to a projected area of a light emission surface of each region. Also, the term "volume" refers to a volume obtained by multiplying the planar area by a distance between a top surface of a fluorescent layer 74 to be described below and a buried insulating layer 36 to be described below.

In some embodiments, at least two of the first to fourth regions 110A, 110B, 110C, and 110D may have different plane shapes. In some embodiments, at least one of the first to fourth regions 110A, 110B, 110C, and 110D may have a plane shape other than a tetragonal shape. In some embodiments, at least one of the first to fourth regions 110A, 110B, 110C, and 110D may have a polygonal plane shape having interior angles other than 90°. In some embodiments, at least one of the first to fourth regions 110A, 110B, 110C, and 110D may have a plane shape of a parallelogram or trapezoid having one interior angle other than 90°.

FIG. 2 is a cross-sectional view illustrating a case in which each of a first region 110A and a third region 110C includes one light-emitting element or a plurality of light-emitting elements.

Referring to FIG. 2, the first region 110A may include one ("a single") light-emitting element PX1, and the third region 110C may include two light-emitting elements PX2 and PX3. It will be understood by one skilled in the art that the third region 110C includes more light-emitting elements than two.

Each of the light-emitting elements PX1, PX2, and PX3 may have, for example, a width of about 10 μm to several mm in a first direction (X direction) or a second direction (Y direction), but the inventive concepts is not limited thereto. Although FIG. 2 illustrates an example in which the light-emitting elements PX1, PX2, and PX3 have the same width or substantially the same width (e.g., the same width within manufacturing tolerances and/or material tolerances) in the second direction, it will be understood by one skilled in the art that the light-emitting elements PX1, PX2, and PX3 have different widths in the second direction.

Light-emitting element structures 20U corresponding respectively to the light-emitting elements PX1, PX2, and PX3 may be disposed in the first region 110A and the third region 110C. The partition walls 120 may be positioned on the light-emitting element structures 20U and surround one light-emitting element structure 20U or a plurality of light-emitting element structures 20U.

The partition walls 120 may have a width of about 10 μm to about 100 μm, but the inventive concepts is not limited thereto. For instance, the width of the partition walls 120 may not necessarily be constant but be made smaller or greater according to positions of the partition walls 120 as needed. For example, the partition wall 120 positioned at an outermost portion of the light-emitting device 10 may be formed to have a width of about 10 μm to about 1 mm, thereby improving structural stability. In some embodiments, even if repetitive vibration and impact are applied to the light-emitting device 10 when the light-emitting device 10 is used as a headlamp for a vehicle, the reliability of the light-emitting device 10 may be improved by excellent structural stability of the light-emitting element structures 20U and the fluorescent layer 74 positioned within the partition walls 120.

A light-emitting stack 20 may include a first conductive semiconductor layer 22, an active layer 24, and a second conductive semiconductor layer 26. The plurality of light-emitting element structures 20U may be isolated from each other by device isolation openings IAH in the first region 110A and the third region 110C. In a process according to some example embodiments, the device isolation openings IAH may be formed by removing portions of the light-emitting stacks 20 so that the plurality of light-emitting element structures 20U may be formed on the first region 110A and the third region 110C.

The plurality of light-emitting element structures 20U may include a first conductive semiconductor layer 22, an active layer 24, and a second conductive semiconductor layer 26, and a first insulating layer 32, a first electrode 42A, a second electrode 42B, a first connection electrode 44A, and a second connection electrode 44B may be further positioned on the plurality of light-emitting element structures 20U.

The first conductive semiconductor layer 22 may be a nitride semiconductor having a composition of n-type $In_xAl_yGa_{(1-x-y)}N$ (where 0≤x<1, 0≤y<1, and 0≤x+y<1). For example, the n-type impurities may be silicon (Si). For example, the first conductive semiconductor layer 22 may include GaN containing n-type impurities.

In some example embodiments, the first conductive semiconductor layer 22 may include a first conductive semiconductor contact layer and a current diffusion layer. An impurity concentration of the first conductive semiconductor contact layer may be in the range of $2 \times 10^{18}$ cm$^{-3}$ to $9 \times 10^{19}$ cm$^{3}$. A thickness of the first conductive semiconductor contact layer may be about 1 μm to about 5 μm. The current diffusion layer may have a structure in which a plurality of $In_xAl_yGa_{(1-x-y)}N$ layers (where 0≤x, y≤1, and 0≤x+y≤1) having different compositions or different impurity contents are alternately stacked. For example, the current diffusion layer may have an n-type superlattice structure in which n-type GaN layers and/or $Al_xIn_yGa_zN$ layers (where 0≤x,y, z≤1, and x+y+z≠0) each having a thickness of about 1 nm to about 500 nm are alternately stacked. An impurity concentration of the current diffusion layer may be in the range of $2 \times 10^{18}$ cm$^{-3}$ to $9 \times 10^{19}$ cm$^{3}$.

The active layer 24 may be positioned between the first conductive semiconductor layer 22 and the second conductive semiconductor layer 26 and may discharge light having some energy by recombination of electrons and holes. The active layer 24 may have a multiple quantum well (MQW) structure in which quantum well layers and quantum barrier layers are alternately stacked. For example, each of the quantum well layers and each of the quantum barrier layers may include $In_xAl_yGa_{(1-x-y)}N$ layers (where 0≤x, y≤1, and 0≤x+y≤1) having different compositions. For example, the quantum well layer may include $In_xGa_{1-x}N$ (where 0≤x≤1), and the quantum barrier layer may include GaN or AlGaN. Thicknesses of the quantum well layer and the quantum barrier layer may be in the range of about 1 nm to about 50 nm. The active layer 24 is not limited to having the MQW structure and may have a single quantum well structure.

The second conductive semiconductor layer 26 may include a nitride semiconductor layer having a composition of p-type $In_xAl_yGa_{(1-x-y)}N$ (where 0≤x<1, 0≤y<1, and 0≤x+y<1). For example, the p-type impurities may be magnesium (Mg).

In example embodiments, the second conductive semiconductor layer 26 may include an electron blocking layer, a low-concentration p-type GaN layer, and a high-concentration p-type GaN layer provided as a contact layer. For example, the electron blocking layer may have a structure in which a plurality of $In_xAl_yGa_{(1-x-y)}N$ layers (where 0≤x, y≤1, and 0≤x+y≤1) having a thickness of about 5 nm to about 100 nm and having different compositions or different impurity contents are alternately stacked, or may include a single layer including $Al_yGa_{(1-y)}N$ (where 0<y≤1). An energy band gap of the electron blocking layer may decrease as a distance from the active layer 24 increases. For example, aluminum (Al) content in the electron blocking layer decreases as the distance from the active layer 24 increases.

The first conductive semiconductor layer 22, the active layer 24, and the second conductive semiconductor layer 26 may be sequentially stacked in a vertical direction. Here, the upper surface of the first conductive semiconductor layer 22 is referred to as a first surface 20F1 of the plurality of light-emitting element structures 20U and the bottom surface of the second conductive semiconductor layer 26 is referred to as a second surface 20F2 of the plurality of light-emitting element structures 20U.

The first electrode 42A may be connected to the first conductive semiconductor layer 22 in an opening E penetrating the active layer 24 and the second conductive semiconductor layer 26. The second electrode 42B may be positioned on the bottom surface (i.e., the second surface 20F2) of the second conductive semiconductor layer 26. The first insulating layer 32 may be positioned on the inner wall of the opening E and electrically insulate the first electrode 42A from the active layer 24 and the second conductive semiconductor layer 26. The first insulating layer 32 may be positioned between the first electrode 42A and the second electrode 42B on the bottom surface of the second conductive semiconductor layer 26 and may electrically insulate the first electrode 42A from the second electrode 42B. Each of the first electrode 42A and the second electrode 42B may include silver (Ag), aluminum (Al), nickel (Ni), chromium (Cr), gold (Au), platinum (Pt), palladium (Pd), tin (Sn), tungsten (W), rhodium (Rh), iridium (Ir), ruthenium (Ru), magnesium (Mg), zinc (Zn), or a combination thereof. Each of the first electrode 42A and the second electrode 42B may include a metal material having high reflectivity.

The first connection electrode 44A may be positioned on the first electrode 42A and the first insulating layer 32, and the second connection electrode 44B may be positioned on the second electrode 42B and the first insulating layer 32. The first connection electrode 44A and the second connection electrode 44B may be electrically connected to the first electrode 42A and the second electrode 42B, respectively. Each of the first connection electrode 44A and the second connection electrode 44B may include Ag, Al, Ni, Cr, Au, Pt, Pd, Sn, W, Rh, Ir, Ru, Mg, Zn, or a combination thereof.

The plurality of light-emitting element structures 20U may be spaced apart from each other with a device isolation opening IAH therebetween. For example, the device isolation opening IAH may include a sidewall that is inclined at an oblique angle of about 60° to about 90° with respect to the first surface 20F1 of the plurality of light-emitting element structures 20U.

An insulating liner 34 may be formed on the inner wall of the device isolation opening IAH and may be conformally positioned to cover the first connection electrode 44A and the second connection electrode 44B on a side surface and the second surface 20F2 of each of the plurality of light-emitting element structures 20U. The upper surface of the insulating liner 34 may be positioned on the same level or substantially the same level (e.g., the same level within manufacturing tolerances and/or material tolerances) as the first surface 20F1 of the plurality of light-emitting element structures 20U. In example embodiments, the insulating liner 34 may include silicon oxide or silicon nitride.

A buried insulating layer 36 may be positioned on the insulating liner 34. The buried insulating layer 36 may be in contact with the insulating liner 34 inside the device isolation opening IAH and may fill the remaining space of the device isolation opening IAH. The buried insulating layer 36 may be an arbitrary insulator and be formed using, for example, a silicone resin, an epoxy resin, or an acrylic resin, but is not limited thereto.

A support substrate 54 may be positioned on the buried insulating layer 36 with an adhesive layer 52 therebetween. In some example embodiments, the adhesive layer 52 may include an electrically insulating material, for example, silicon oxide, silicon nitride, a polymeric material such as an ultraviolet (UV) curable material, or resin. In some embodiments, the adhesive layer 52 may include the same material as the buried insulating layer 36, and a boundary between the adhesive layer 52 and the buried insulating layer 36 may not be discernible. In some example embodiments, the adhesive layer 52 may include a eutectic adhesive material such as AuSn or NiSi. The support substrate 54 may include, but is not limited to, a sapphire substrate, a glass substrate, a transparent conductive substrate, a silicon substrate, or a silicon carbide substrate, but is not limited thereto.

As described above, partition walls 120 may be positioned on the first surface 20F1 of the plurality of light-emitting element structures 20U. The partition walls 120 may include silicon (Si), silicon carbide (SiC), sapphire, and/or gallium nitride (GaN).

The partition walls 120 may be arranged in a matrix form in a plan view, and a plurality of pixel spaces PXU may be defined by the partition walls 120. The partition walls 120 may vertically overlap the device isolation opening IAH, and bottom surfaces of the partition walls 120 may be in contact with the upper surface of the insulating liner 34. Accordingly, the first surface 20F1 of the plurality of light-emitting element structures 20U may be exposed to bottoms of the plurality of pixel spaces PXU.

A reflective layer 72 may be positioned on sidewalls of the partition walls 120. The reflective layer 72 may reflect light emitted from the plurality of light-emitting element structures 20U. The reflective layer 72 may be formed on the sidewalls of the partition walls 120 and thus sidewalls of the plurality of pixel spaces PXU may be covered with the reflective layer 72.

In example embodiments, the reflective layer 72 may include a metal layer including Ag, Al, Ni, Cr, Au, Pt, Pd, Sn, W, Rh, Ir, Ru, Mg, Zn, or a combination thereof. In other embodiments, the reflective layer 72 may include a resin layer such as polyphthalamide (PPA) containing a metal oxide such as titanium oxide or aluminum oxide. In other embodiments, the reflective layer 72 may include a distributed Bragg reflector layer. For example, the distributed Bragg reflector layer may have a structure in which a plurality of insulating films having different refractive indexes are stacked repeatedly several times to several hundred times. Each of the insulating films in the distributed Bragg reflector layer may include oxide, nitride, or a combination thereof, for example, $SiO_2$, $SiN$, $SiO_xN_y$, $TiO_2$, $Si_3N_4$, $Al_2O_3$, $TiN$, $AlN$, $ZrO_2$, $TiAlN$, or $TiSiN$.

A fluorescent layer 74 may be positioned in the plurality of pixel spaces PXU on the first surface 20F1 of the plurality of light-emitting element structures 20U. As shown in FIG. 2, the fluorescent layer 74 may fill substantially the entire space of the plurality of pixel spaces PXU, a lower surface level of the fluorescent layer 74 may be equal to a lower surface level LV1 of the partition walls 120, which may be a surface level of the first surface 20F1 of the plurality of light-emitting element structures 20U, and an upper surface level of the fluorescent layer 74 may be equal to an upper surface level LV2 of the partition walls 120. The fluorescent layer 74 may have a substantially flat upper surface.

The fluorescent layer 74 may include a single material capable of converting the color of light emitted from the light-emitting element structure 20U into a desired color. That is, a fluorescent layer 74 associated with the same color may be positioned in the plurality of pixel spaces PXU. However, the inventive concepts is not limited thereto. For example, the color of a fluorescent layer 74 positioned in some of the plurality of pixel spaces PXU may be different from the color of a fluorescent layer 74 positioned in the remaining pixel spaces PXU.

The fluorescent layer 74 may include a resin containing a fluorescent material dispersed therein or a film containing a fluorescent material. For example, the fluorescent layer 74 may include a fluorescent material film in which fluorescent material particles are uniformly dispersed at a certain concentration. The fluorescent material particles may be a wavelength conversion material that changes the wavelength of light emitted from the plurality of light-emitting element structures 20U. The fluorescent layer 74 may include two or more kinds of fluorescent material particles having different size distributions to improve the density of the fluorescent material particles and improve color uniformity.

In some example embodiments, a fluorescent material of the fluorescent layer 74 may have various colors and various compositions such as an oxide-based composition, a silicate-based composition, a nitride-based composition, and a fluoride-based composition. For example, $\beta$-SiAlON:$Eu^{2+}$ (green), $(Ca,Sr)AlSiN_3$:$Eu^{2+}$(red), $La_3Si_6N_{11}$:$Ce^{3+}$(yellow), $K_2SiF_6$:$Mn_4^+$(red), $SrLiAl_3N_4$:$Eu$(red), $Ln_{4-x}(Eu_zM_{1-z})_xSi_{12-y}Al_yO_{3+x+y}N_{18-x-y}$ ($0.5 \le x \le 3$, $0 < z < 0.3$, $0 < y \le 4$) (red), $K_2TiF_6$:$Mn_4^+$(red), $NaYF_4$:$Mn_4^+$ (red), $NaGdF_4$:$Mn_4^+$ (red), and the like may be used as the fluorescent material. However, the kind of the fluorescent material is not limited thereto.

In some example embodiments, a wavelength conversion material such as a quantum dot may be further positioned over the fluorescent layer 74. The quantum dot may have a core-shell structure using a III-V or II-VI compound semiconductor. For example, the quantum dot may have a core such as CdSe and InP and a shell such as ZnS and ZnSe. In addition, the quantum dot may include a ligand for stabilizing the core and the shell.

In some embodiments, the reflective layer 72 may not be formed on the sidewall of the partition wall 120, unlike that shown in FIG. 2. In this case, the sidewall of the partition wall 120 may be in contact with the fluorescent layer 74.

Figure 3A:
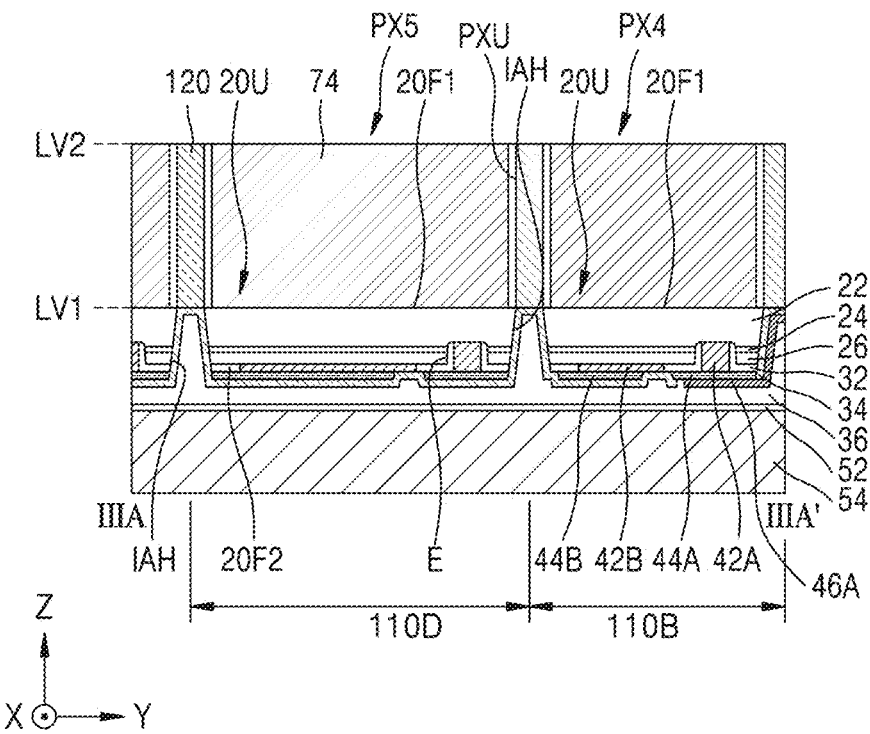
FIG. 3A is a cross-sectional view illustrating a case in which each of a second region and a fourth region includes one light-emitting element, according to some example embodiments.
Figure 3B:
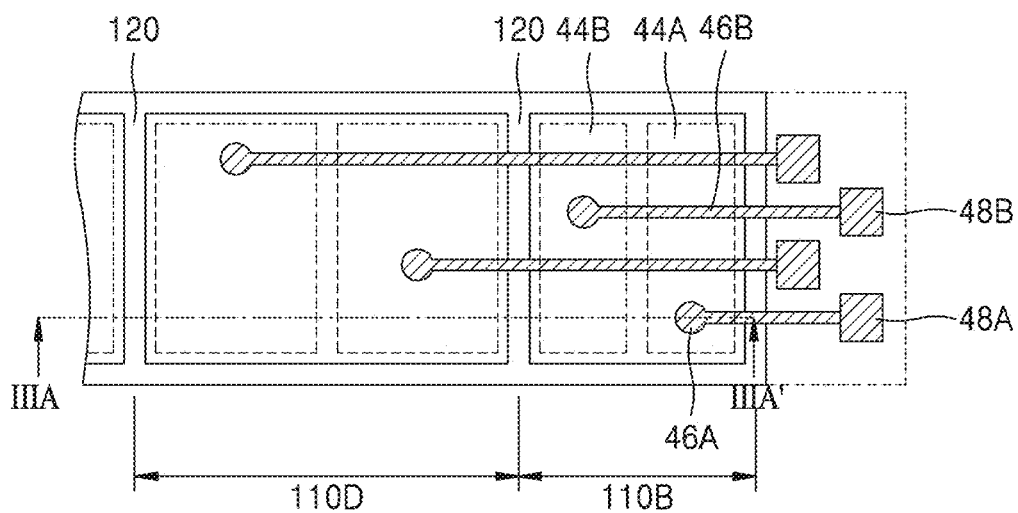
FIG. 3B is a plan view of plane shapes of the second region and the fourth region of FIG. 3A, according to some example embodiments.

FIG. 3A is a cross-sectional view illustrating a case in which each of a second region 110B and a fourth region 110D includes one light-emitting element. FIG. 3B is a plan view of plane shapes of the second region 110B and the fourth region 110D. In particular, FIG. 3A is a cross-sectional view taken along a line IIIA-IIIA' of FIG. 3B.

Some example embodiments, including the example embodiments illustrated in FIGS. 3A and 3B, are generally similar to the example embodiments shown in FIG. 2 except that each of the regions includes one light-emitting element and a planar area and/or volume of the light-emitting element of the fourth region 110D are greater than a planar area and/or volume of the light-emitting element of the second region 110B, which is different from the fourth region 110D. Accordingly, a repeated description will be omitted for brevity.

Referring to FIGS. 3A and 3B, the second region 110B may include one light-emitting element PX4, and the fourth region 110D may include one light-emitting element PX5. The fourth region 110D may have a greater planar area and/or volume than those of the second region 110B, and the light-emitting element PX5 may have a greater planar area and/or volume than those of the light-emitting element PX4.

When a region (i.e., the fourth region 110D) having a relatively great area uses only one light-emitting element having a relatively large size instead of a plurality of light-emitting elements, the number ("quantity") of driver chips required for a drive operation may be reduced. Thus, power consumption may be reduced to increase economic efficiency.

A first connection electrode 44A may pass through an insulating liner 34 and be electrically connected to a first pad 48A through a first wiring pattern 46A. A second connection electrode 44B may pass through the insulating liner 34 and be electrically connected to a second pad 48B through a second wiring pattern 46B.

It will be understood by one skilled in the art that, from among cross-sectional views of the accompanying drawings, a cross-sectional view in which the first and second wiring patterns 46A and 46B are not shown is a cross-sectional view taken along a line that does not cross the first and second wiring patterns 46A and 46B and does not imply that a specific light-emitting element has no wiring patterns.

Figure 4:
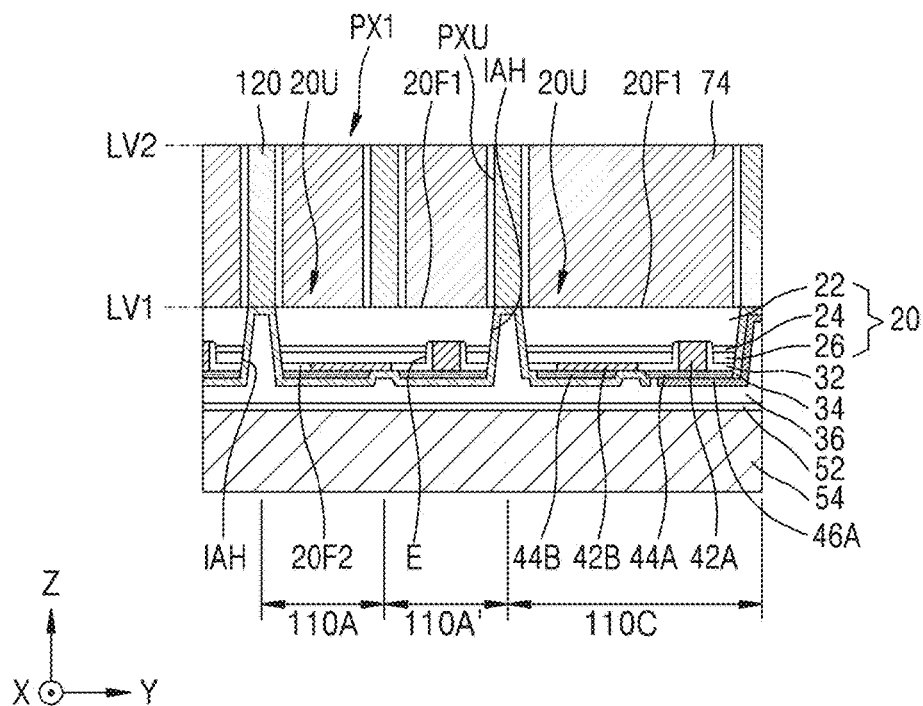
FIG. 4 is a cross-sectional view illustrating a case in which one light-emitting element is shared between two regions, according to some example embodiments.

FIG. 4 is a cross-sectional view illustrating a case in which one light-emitting element is shared between two regions 110A and 110A', such that the two regions 110A and 110A are separate regions of a single light-emitting element PX1.

Some example embodiments, including the example embodiments shown in FIG. 4, are generally similar to the example embodiments shown in FIG. 2, except that one light-emitting element is shared between two regions. Accordingly, a repeated description will be omitted for brevity.

Referring to FIG. 4, one light-emitting element PX1 may be shared between two regions 110A and 110A'. In this case, a planar area and/or volume of one region 110A or 110A' may be smaller than a planar area/or volume of one light-emitting element PX1. In this case, a partition wall 120 may be provided in an upper portion of the light-emitting element PX1 across the light-emitting element PX1. The partition wall 120 positioned across the light-emitting element PX1 may be the partition wall 120 by which the two regions 110A and 110A' are divided from each other.

Figure 5:
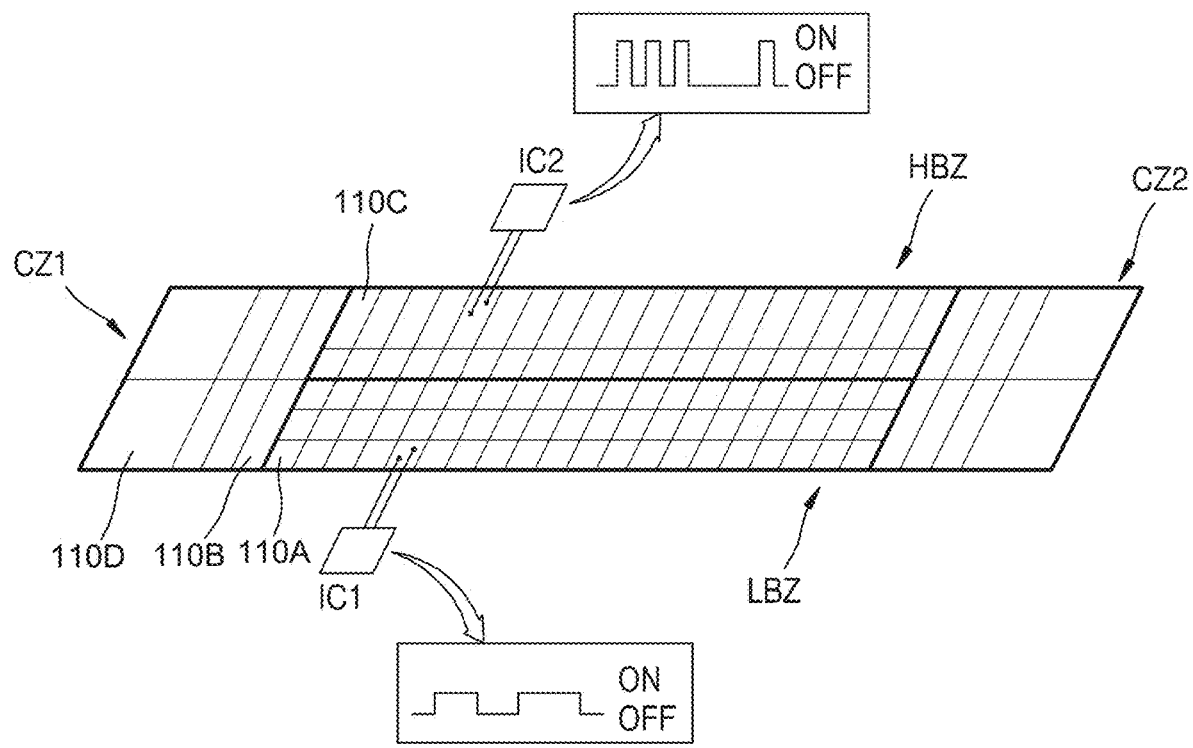
FIG. 5 is a diagram of a light-emitting device according to some example embodiments.

FIG. 5 is a diagram of a light-emitting device 10A according to some example embodiments.

The light-emitting device 10A may include at least two zones configured to serve separate functions. For example, the light-emitting device 10A may include a high-beam zone HBZ, a low-beam zone LBZ, and corner zones CZ1 and CZ2. Since the respective zones serve different functions, the zones may be driven in different ways. Accordingly, electrical characteristics of driving signals or driving elements (e.g., driver chips) for driving the zones may be different.

For example, since light-emitting elements of the low-beam zone LBZ require a relatively small number of times of on/off operations and a high light intensity, the light-emitting elements of the low-beam zone LBZ may use a driving signal having a relatively low frequency and relatively high driving voltage and current and adopt a driving element IC1 capable of fulfilling the requirements. Meanwhile, since light-emitting elements of the high-beam zone HBZ involve relatively frequent on/off operations, the light-emitting elements of the high-beam zone HBZ may use a driving signal having a high frequency and relatively low driving voltage and current and adopt a driving element IC2 that may sensitively respond to an appropriate control signal.

The driving signals and the driving elements IC1 and IC2 shown in FIG. 5 are only examples, and differences in electrical characteristics between driving elements may be differences in various aspects such as a driving voltage, a driving current, a driving duty, and frequency characteristics. For example, a first region 110A may be driven in response to a first driving signal, and a second region 110B may be driven in response to a second driving signal that is separate from the first driving signal, where the first driving signal is different from the second driving signal in a driving voltage, a driving current, a driving duty, a sub-combination thereof, or a combination thereof.

Although FIG. 5 illustrates differences between driving elements of the high-beam zone HBZ and driving elements of the low-beam zone LBZ, there may be differences in electrical characteristics between the driving elements of the high-beam zone HBZ and driving elements of the corner zones CZ1 and CZ2, and there may be differences in electrical characteristics between the driving elements of the low-beam zone LBZ and the driving elements of the corner zones CZ1 and CZ2.

Each of the low-beam zone LBZ, the high-beam zone HBZ, and the corner zones CZ1 and CZ2 may include at least two light-emitting elements (refer to PX1, PX2, and PX3 of FIG. 2 and PX4 and PX5 of FIG. 3), and different driving signals (information) may be used for individual light-emitting elements of the same region. For example, in the high-beam zone HBZ, only a specific partial region may be turned off, and other regions may be turned on. In this case, when the high-beam zone HBZ is controlled by a multi-channel driving element, different driving signals (information) may be transmitted to respective channels and thus, only a portion of the high-beam zone HBZ may be controlled dark. Restated, for example with reference to FIG. 5, in the low-beam zone LBZ, a first region 110A may be configured to be driven in response to a first driving signal and a second region 110B may be configured to be driven in response to a second driving signal that is separate from the first driving signal.

Differences in electrical characteristics of driving elements according to zone may ultimately lead to differences in light emitted according to zone. However, the differences in light emitted according to zone may not depend solely on the electrical characteristics of the driving elements.

Figure 18A:
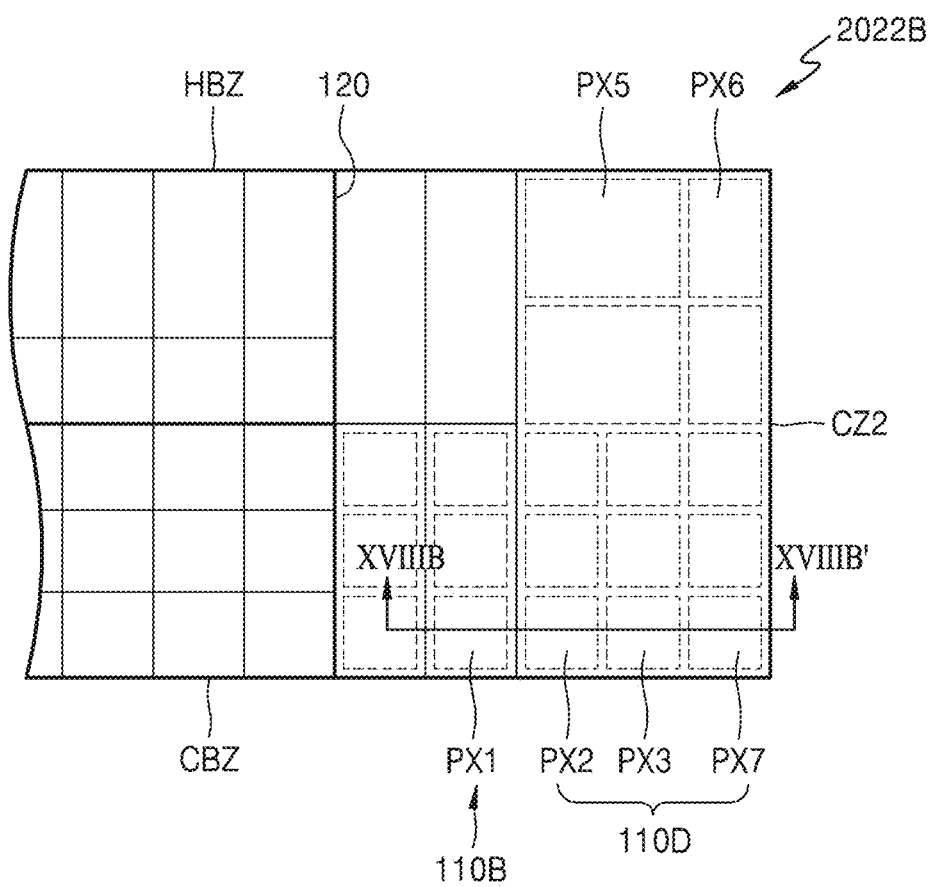
FIG. 18A is a partial plan view of a headlamp module according to some example embodiments.
Figure 18B:
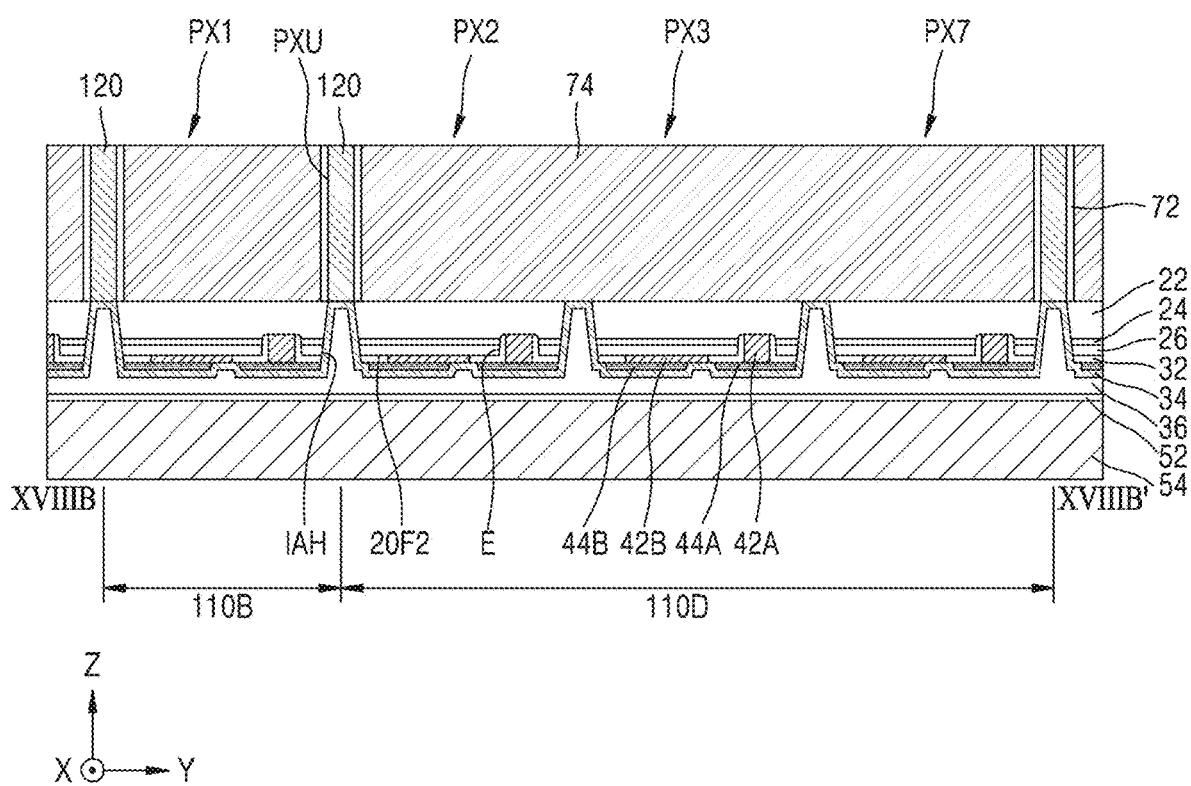
FIG. 18B is a cross-sectional view taken along a line B-B' of FIG. 18A according to some example embodiments.
Figure 18C:
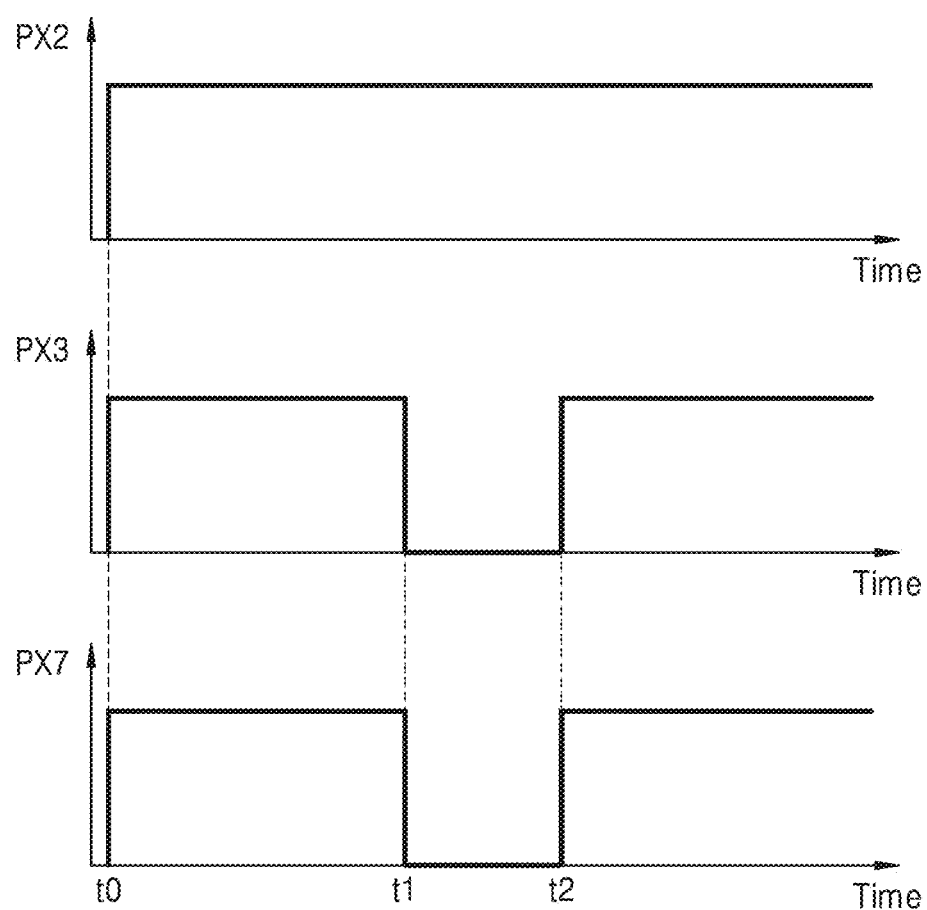
FIG. 18C is a timing diagram illustrating an example of an operation of each of light-emitting elements of the headlamp module of FIG. 18A according to some example embodiments.

FIG. 18A is a partial plan view of a headlamp module 2022B according to some example embodiments. FIG. 18B is a cross-sectional view taken along a line XVIIIB-XVIIIB' of FIG. 18A. FIG. 18C is a timing diagram illustrating an example of an operation of each of light-emitting elements PX2, PX3, and PX7 of the headlamp module 2022B of FIG. 18A.

Referring to FIGS. 18A to 18C, three light-emitting elements PX1 may be positioned adjacent to each other in a second region 110B. Light-emitting elements PX2, PX3, and PX7 having the same size or substantially the same size (e.g., the same size within manufacturing tolerances and/or material tolerances) may be provided in a fourth region 110D. In particular, the light-emitting element PX7 may be provided at an outermost portion of the headlamp module 2022B. Although the light-emitting elements PX2, PX3, and PX7 are illustrated as having substantially the same planar area (e.g., the same planar area within manufacturing tolerances and/or material tolerances), the light-emitting elements PX2, PX3, and PX7 may have different sizes like light-emitting elements PX5 and PX6. In some example embodiments, including the example embodiments, shown in FIGS. 18A-18B, each region of a first and second region (e.g., the first region 110A and the second region 110B) may include a plurality of light-emitting elements, where the light-emitting elements of the first region have a substantially common size (e.g., the same size within manufacturing tolerances and/or material tolerances) as the plurality of light-emitting elements of the second region.

In some embodiments, the light-emitting element PX2 positioned relatively inward in the corner zone CZ2 of the headlamp module 2022B may be controlled to be turned on at a time point 't0' and continuously emit light. Also, the light-emitting elements PX3 and PX7 positioned relatively outward in the corner zone CZ2 of the headlamp module 2022B may be turned on at the time point 't0' and then temporarily turned off between time points 't1' and 't2'. While the light-emitting elements PX3 and PX7 are being turned off, light emitted by the light-emitting element PX2 may be scattered and diffused even above the light-emitting elements PX3 and PX7 and thus, a gradation effect of gradual darkening with a natural luminance may be obtained. Light emission may be suddenly blocked at an edge of the headlamp module 2022B having enhanced straightness, thereby alleviating a feeling of heterogeneity and visual disturbance due to sudden contrast between a region irradiated with light and a region that is not irradiated with light. That is, by turning off some light-emitting elements, such as the light-emitting elements PX3 and PX7, when necessary, it may be possible to ensure a natural visual field of a boundary region irradiated with light due to a gradation effect.

Figure 10:
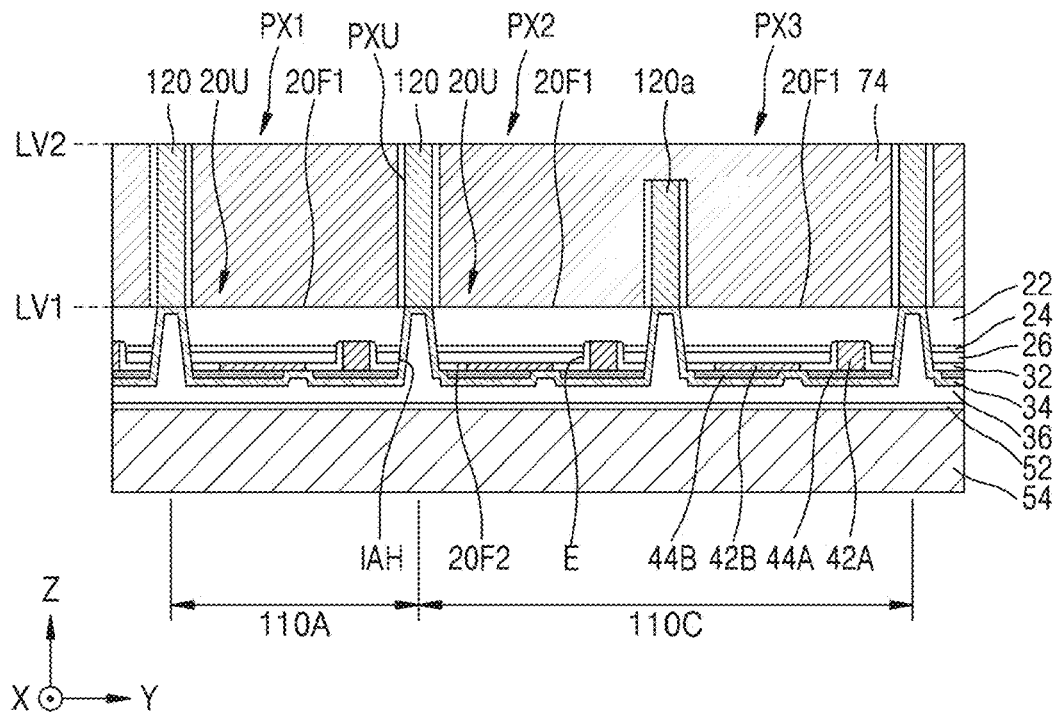
FIG. 10 is a cross-sectional view of a portion of a light-emitting device in which a height of a partition wall is changed, according to some example embodiments.

In some embodiments, fluorescent layers 74 above the light-emitting elements PX3 and PX7 of FIG. 18B may be maintained, while the light-emitting elements PX3 and PX7 may be omitted. In this case, a boundary region irradiated with light emitted from the headlamp module 2022B may obtain a permanent gradation effect. As shown in at least FIG. 18B, in some example embodiments, each separate emission region (e.g., second region 110B and fourth region 110D) includes a separate fluorescent layer 74 of a plurality of fluorescent layers 74, where the plurality of fluorescent layers 74 are isolated from each other, by one or more partition walls 120, in adjacent emission regions. For example, as shown in FIG. 10, the plurality of fluorescent layers 74 may be isolated from each other, by one or more partition walls 120, in adjacent emission regions of a low-beam zone LBZ of the light-emitting device 10.

In the fourth region 110D positioned in the corner zone CZ2 of the headlamp module 2022B, an area having a permanent or temporary gradation effect in the fourth region 110D may be defined as a gradation area. The gradation area may be an area having a temporary gradation effect, such as the above-described light-emitting elements PX3 and PX7, or an area having a permanent gradation effect, such as an area in which the fluorescent layer 74 exists but light-emitting elements do not exist under the fluorescent layer 74. Accordingly, the fourth region 110D may include a gradation area.

In some embodiments, a percentage of a planar area of the gradation area to a planar area of the fourth region 110D may range from about 50% to about 90%. Restated, a planar area of the gradation area of the fourth region 110D may be between about 50% to about 90% of a planar area of the fourth region 110D. If the percentage of the planar area of the gradation area is too low, a gradation effect may be insufficient. If the percentage of the planar area of the gradation area is too high, the fourth region 110D may have insufficient luminance so that the headlamp module 2022B may not have desired brightness.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Figure 6A:
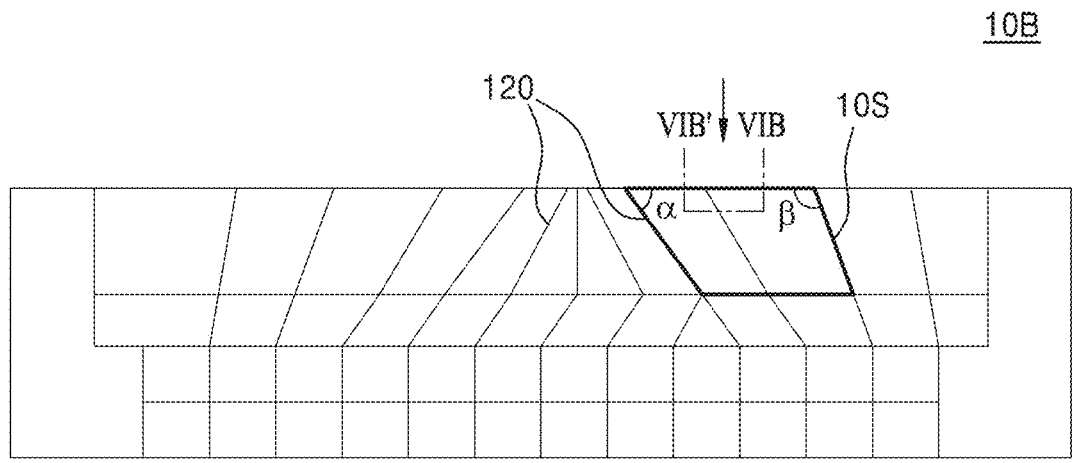
FIG. 6A is a plan view of a light-emitting device according to some example embodiments.
Figure 6B:
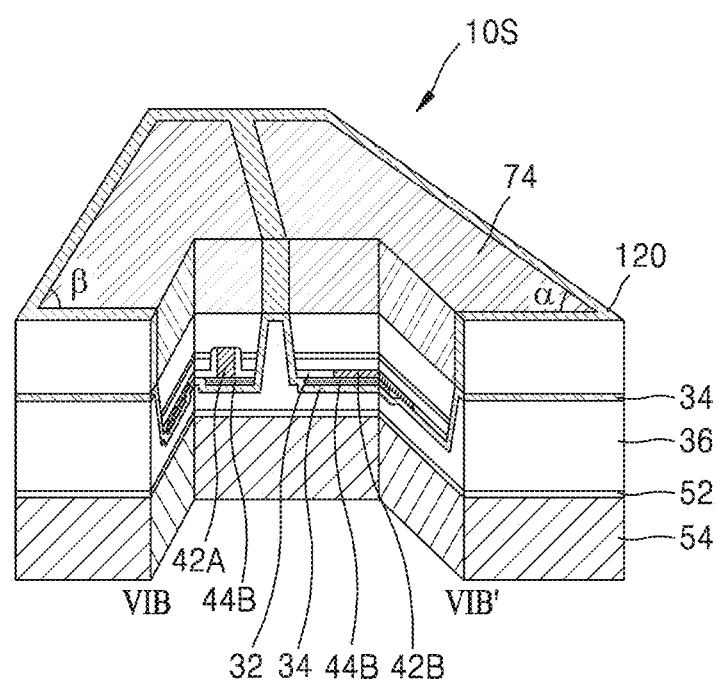
FIG. 6B is a partial cut-away perspective view taken along a line B-B' of FIG. 6A.

FIG. 6A is a plan view of a light-emitting device 10B according to some example embodiments. FIG. 6B is a partial cut-away perspective view taken along a line VIB-VIB' of FIG. 6A.

Referring to FIG. 6A, regions included in the light-emitting device 10B may have a plane shape other than a rectangular shape or a square shape. For example, some regions of the light-emitting device 10B shown in FIG. 6A may have a polygonal shape including at least one interior angle other than 90°. In some embodiments, some regions of the light-emitting device 10B may have a tetragonal shape including at least one interior angle other than 90°. In some embodiments, some regions of the light-emitting device 10B may have a shape of a parallelogram or trapezoid having at least one interior angle other than 90°. For example, in some example embodiments, at least one region of the first region 110A and the second region 110B has a rectangular plane shape and at least one other region of the first region 110A and the second region 110B has a polygonal plane shape having one or more interior angles that are other than 90°.

When the light-emitting device 10B includes regions having a planar shape other than a square shape or a rectangular shape, a brightness distribution of a region to be illuminated by the light-emitting device 10B may be controlled more finely using relatively low power, as will be described in further detail below.

FIG. 6B is a partial cut-away perspective view obtained by cutting two regions denoted by 10S, from among the regions of FIG. 6A, along the B-B' of FIG. 6A.

Referring to FIGS. 6A and 6B together, two regions denoted by 10S may respectively have interior angles α and β other than 90°. As shown in FIG. 6B, each of the two regions denoted by 10S may be surrounded by the partition wall 120.

As shown in FIG. 6B, a specific configuration of a cross-section may be substantially the same as shown in FIGS. 2 to 4. A plane shape of the light-emitting device 10B may be implemented as a shape other than a tetragonal shape or a rectangular shape while maintaining the above-described configuration.

Although only the two regions denoted by 10S are separately shown in FIG. 6B, this does not mean that the two regions denoted by 10S are more similar to each other than other regions. The regions surrounded by the partition wall 120 shown in FIG. 6A may be the same as each other as described with reference to FIGS. 1 to 4 or be different from each other.

Figure 7:
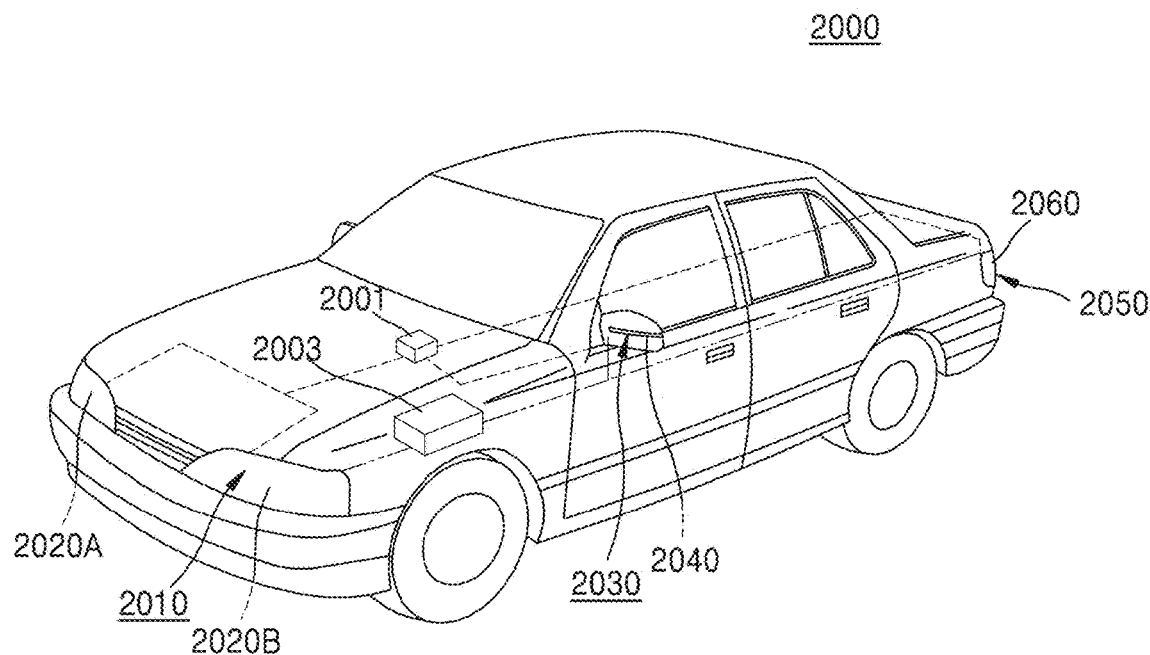
FIG. 7 is a perspective view of a vehicle according to some example embodiments.

FIG. 7 is a perspective view of a vehicle 2000 according to some example embodiments.

Although FIG. 7 illustrates an automobile as the vehicle 2000, the vehicle 2000 is not limited thereto. The vehicle 2000 may be a land vehicle such as a bicycle, a tricycle, a passenger car, a caterpillar tractor, a train, or a tram; a marine vehicle such as a ship, a boat, and a submarine; and an air vehicle such as a plane and a helicopter, but is not limited thereto.

Referring to FIG. 7, headlamp modules 2020A and 2020B (a headlamp module may be referred to interchangeably herein as a "headlamp") may be installed in a headlamp unit 2010 of the vehicle 2000. A side mirror lamp module 2040 may be installed in an outer side mirror unit 2030, and a tail lamp module 2060 may be installed in a tail lamp unit 2050. At least one of the headlamp modules 2020A and 2020B, the side mirror lamp module 2040, and the tail lamp module 2060 may be a light source module including the above-described light-emitting devices 10, 10A, and 10B.

A power supply device 2003 embedded in the vehicle 2000 may supply power to each of the headlamp modules 2020A and 2020B, the side mirror lamp module 2040, and the tail lamp module 2060. Also, a controller 2001 embedded in the vehicle 2000 may be configured to control operations including on/off operations of the headlamp modules 2020A and 2020B, the side mirror lamp module 2040, and the tail lamp module 2060, thereby being configured to control the headlamp modules 2020A and 2020B, the side mirror lamp module 2040, and the tail lamp module 2060.

Figure 8:
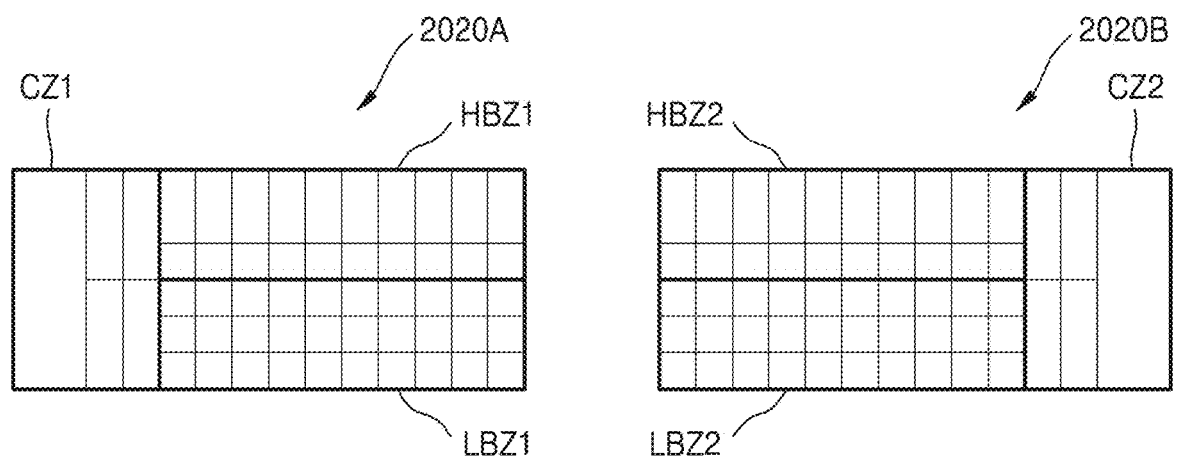
FIG. 8 is a front view of a headlamp module provided in a headlamp unit of FIG. 7 according to some example embodiments.

FIG. 8 is a front view of the headlamp modules 2020A and 2020B provided in the headlamp unit 2010 of FIG. 7.

Referring to FIG. 8, the headlamp modules 2020A and 2020B may include high-beam zones HBZ1 and HBZ2, low-beam zones LBZ1 and LBZ2, and corner zones CZ1 and CZ2, respectively. In some embodiments, the high-beam zones HBZ1 and HBZ2, the low-beam zones LBZ1 and LBZ2, and the corner zones CZ1 and CZ2 may be symmetrically positioned about a central line of the vehicle 2000. Restated, and as shown in FIG. 8, the headlamp modules 2020A and 2020B may include separate, respective pluralities of emission regions that are symmetrically arranged in relation to each other about the central line of the vehicle 2000. As shown in at least FIG. 8, the corner zones CZ1 and CZ2 may extend over at least one of side surfaces of the high-beam zones HBZ1 and HBZ2 and one of side surfaces of the low-beam zones LBZ1 and LBZ2, respectively.

The emission regions of the corner zones CZ1 and CZ2 may have planar areas and/or volumes substantially greater than those of the emission regions of the high-beam zones HBZ1 and HBZ2 or the low-beam zones LBZ1 and LBZ2, respectively. The emission regions of the corner zones CZ1 and CZ2 may mainly contribute to illuminating both sides of the front and may not necessarily be finely controlled in connection to a vehicle coming face-to-face from the front. Particularly, in some cases, the emission regions of the corner zones CZ1 and CZ2 may be used only for redirection. Therefore, since the corner zones CZ1 and CZ2 have low control burdens, manufacturing costs and operating energy may be reduced by increasing the size of emission regions and reducing the number of driving elements.

In particular, an average area of the emission regions of the corner zones CZ1 and CZ2 may be greater than an average area of the emission regions of the high-beam zones HBZ1 and HBZ2 and the emission regions of the low-beam zones LBZ1 and LBZ2. In some embodiments, the corner zones CZ1 and CZ2 may adopt light-emitting elements having relatively large areas. In this case, an average area of the light-emitting elements of the corner zones CZ1 and CZ2 may be greater than an average area of light-emitting elements of the high-beam zones HBZ1 and HBZ2, the average area of the light-emitting elements of the low-beam zones LBZ1 and LBZ2, a sub-combination thereof, or a combination thereof.

Furthermore, as described above, the emission regions of the corner zones CZ1 and CZ2 may be scaled up, thereby reducing the number of driving elements. The number ("quantity") of driving elements (e.g., driver chips) configured to control the light-emitting elements of the corner zones CZ1 and CZ2 may be equal to or less than one-half (½) of the number of driving elements configured to control light-emitting elements of any one zone of the high-beam zones HBZ1 and HBZ2 and the low-beam zones LBZ1 and LBZ2.

Each of the high-beam zones HBZ1 and HBZ2, the low-beam zones LBZ1 and LBZ2, and the corner zones CZ1 and CZ2 may include a plurality of emission regions (e.g., the first region 110A and the second region 110B described with reference to FIGS. 1 and 2). Although emission regions included in the same zone generally operate in the same manner, the emission regions included in the same zone may operate in different manners as needed. Also, the emission regions included in the same zone may not necessarily have the same plane shape or configuration.

The headlamp modules 2020A and 2020B may be variously modified considering users' need, law and regulations defined in relation to the vehicle 2000, and safety.

Figure 9A:
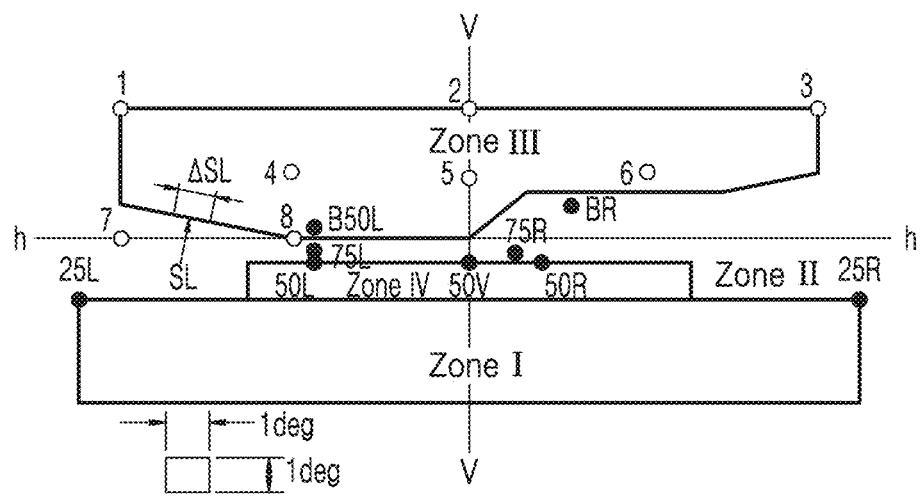
FIG. 9A is a diagram showing a photometric grid defined in Electrical and Computer Engineering (ECE) regulation 112 (R112) according to some example embodiments.
Figure 9B:
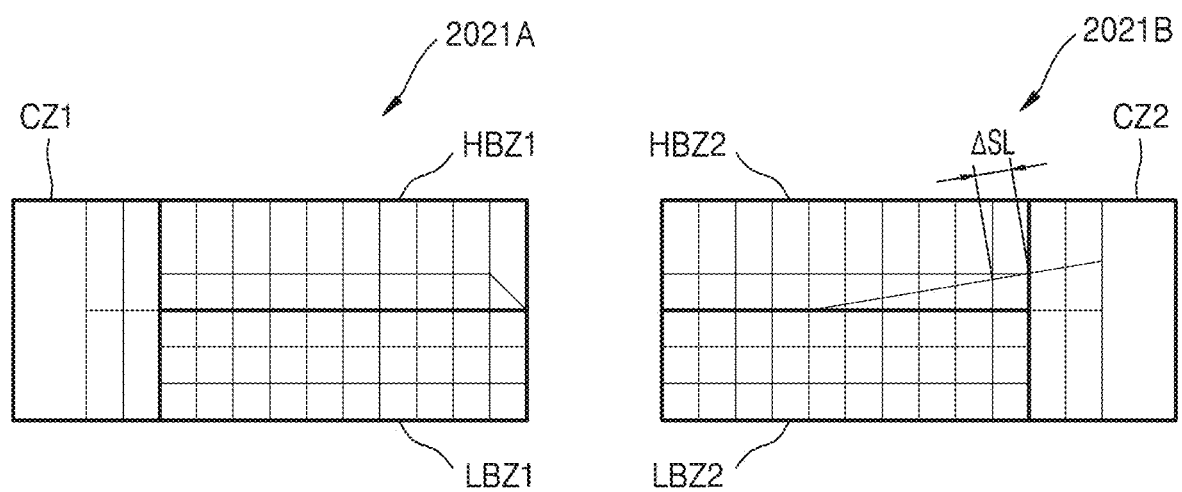
FIG. 9B is a diagram of a pair of headlamp modules according to some example embodiments, which satisfy photometric grid conditions of ECE R112.

FIG. 9A is a diagram showing a photometric grid defined in the Electrical and Computer Engineering (ECE) regulation 112 (R112), and FIG. 9B is a diagram of a pair of ("two") headlamp modules 2021A and 2021B according to some example embodiments, which satisfy photometric grid conditions of ECE R112.

Referring to FIGS. 9A and 9B, when the headlamp modules 2021A and 2021B are operated, each zone and each specific point may have constant values to be satisfied 25 m ahead. In particular, a partial cut-off region may be defined in a slant direction in Zone III and will be hereinafter referred to as a slant portion SL.

In the related art, in order to implement the slant portion SL of a cut-off line, the size of light-emitting elements was reduced, and the number of light-emitting elements along the slant portion SL was increased. As a result, a structure configured to finely control a number of light-emitting elements to implement the slant portion SL has been attempted. However, since the number of light-emitting elements to be controlled increases, the number of driving elements may also increase, and power consumption may also increase. In some example embodiments, an emission region having a shape corresponding to the slant portion SL or a portion of the slant portion SL is implemented by a single light-emitting element.

In contrast, in embodiments, an emission region corresponding to a slant portion SL or a portion of the slant portion SL may be designed to have a slant unit. Thus, since it is unnecessary to reduce the size of light-emitting elements and increase the number of driving elements, power consumption may be reduced. That is, a portion (or a portion denoted by ΔSL in FIG. 9A) of the slant portion SL of FIG. 9A may be directly implemented by one emission region (a portion denoted by ΔSL in FIG. 9B) of the headlamp module 2021B of FIG. 9B. As a result, the size of emission regions of the headlamp module 2021B may be increased as needed, it may be unnecessary to increase the number of driving elements, and power consumption may be reduced.

Although only the ECE R112 has been described, it will be understood by one skilled in the art that the same technique may be applied to photometric grids defined in ECE R98, ECE R112, ECE R113, ECE R123, federal motor vehicle safety standards (FMVSS), a sub-combination thereof, or a combination thereof. Restated, an emission region may have a shape corresponding to a slant portion SL of a photometric grid, or a portion of the slant portion of the photometric grid, where the photometric grid is defined in ECE R98, ECE R112, ECE R113, ECE R123, federal motor vehicle safety standards (FMVSS), a sub-combination thereof, or a combination thereof.

FIG. 10 is a cross-sectional view of a portion of a light-emitting device in which a height of a partition wall is changed, according to some example embodiments.

Referring to FIG. 10, some partition walls (e.g., 120a) of a plurality of partition walls 120 and 120a may have a height, thickness, or height and thickness that is different than that of other partition walls ("a remainder partition wall of the plurality of partition walls") (e.g., 120). Such some partition walls (e.g., 120a) may contribute to a different in emission factor between separate regions (e.g., 110A and 110B). In this case, fluorescent layers 74 of two adjacent regions with the partition wall 120a therebetween may be connected to each other over one or more partition walls 120a between adjacent emission regions, for example between adjacent emission regions in a high-beam zone. In this case, since the partition wall 120 between a light-emitting element PX1 and two adjacent light-emitting elements PX2 and PX3 is maintained high, contrast therebetween may be maintained high. Meanwhile, since the partition wall 120a between the two adjacent light-emitting elements PX2 and PX3 is relatively low, optical interaction therebetween may be enabled and thus, contrast may be low, but light emission may increase. In some example embodiments, where the first and third regions 110A and 110C as shown in FIG. 10 are in a high-beam zone of the light-emitting device 10, the fluorescent layers 74 of the adjacent regions 110A and 110C with partition wall 120 therebetween may be connected to each other over the partition wall 120 such that the connected fluorescent layers 74 cover the partition wall 120 similarly to partition wall 120a.

For example, the emission regions of the low-beam zone LBZ may be used to emit light to display ("output," "provide," or the like) relevant information for vehicle-driving ("relevant information associated with driving of the vehicle 2000) on front sides of the above-described headlamp modules 2020A and 2020B. In this case, the emission regions of the low-beam zone LBZ may require a high contrast. Top ends of the partition walls 120 may be in the same or substantially same plane (e.g., the same plane within manufacturing tolerances and/or material tolerances) with top ends of the fluorescent layers 74 so that the relevant information for vehicle-driving may be clearly displayed on the front sides of the above-described headlamp modules 2020A and 2020B.

Figure 11:
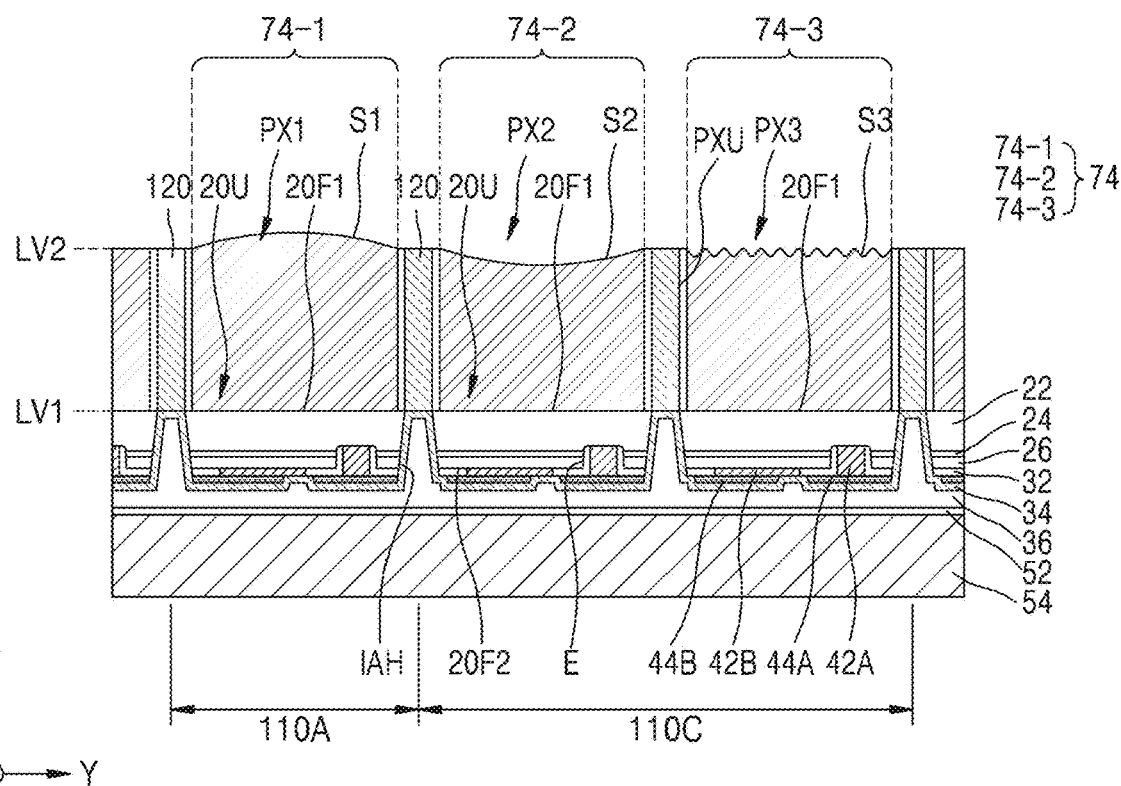
FIG. 11 is a cross-sectional view of a portion of a light-emitting device in which a shape of a free surface is changed, according to some example embodiments.

FIG. 11 is a cross-sectional view of a portion of a light-emitting device in which a shape of a free surface is changed, according to some example embodiments. As described herein, a "free surface" may be understood to be a surface that is exposed ("open") to an exterior of the light-emitting device (e.g., a surface through which emitted light passes to exit the light-emitting device and illuminate at least a portion of an external environment.

As shown in FIG. 11, a fluorescent layer 74 may be formed to fill the plurality of pixel spaces PXU, where each pixel space PXU may be an open enclosure that is at least partially defined by one or more light-emitting elements PX1 to PX3 and one or more partition walls 120, such that the fluorescent layer 74 includes separate portions 74-1, 74-2, 74-3 that are in separate regions. For example, as shown in FIG. 11, a first portion 74-1 of the fluorescent layer 74 in a first open enclosure defined by a first light-emitting element PX1 and one or more partition walls 120, a second portion 74-2 of the fluorescent layer 74 in a second open enclosure defined by a second light-emitting element PX2 and the one or more partition walls 120, and the third portion 74-3 of the fluorescent layer 74 is in a third open enclosure defined by a third light-emitting element PX3 and the one or more partition walls. As shown in FIG. 11, each separate portion 74-1 to 74-3 of the fluorescent layer 74 may have a separate free surface S1 to S3. Each free surface of a portion of a fluorescent layer 74 that is on a given light-emitting element may be referred to herein as a free surface of the given light-emitting element.

Referring to FIG. 11, free surfaces S1, S2, and S3 of light-emitting elements PX1, PX2, and PX3 may have various shapes, such that different regions have different free surface characteristics. As shown in FIG. 11, in some example embodiments, each free surface S1, S2, S3 of a free surface of the first portion 74-1 of the fluorescent layer 74 (which is in a first region 110A), a free surface S2 of a second portion 74-2 of the fluorescent layer 74 (which is in a separate, third region 110C), and a free surface S3 of a third portion 74-3 of the fluorescent layer 74 (which is in the third region 110C) has free surface characteristics of any one of a flat surface, a concave surface (e.g., free surface S2), a convex surface (e.g., free surface S1), and a rough surface (e.g., free surface S3). Accordingly, for example as shown in FIG. 1, one region (e.g., the first region 110A) may have different free surface characteristics from another region (e.g., the third region 110C), by virtue of including free surfaces having different free surface characteristics (e.g., the free surface S1 in the first region 110A has a convex surface while the free surfaces S2 and S3 in the third region 110C have a concave surface and a rough surface, respectively).

For example, in some embodiments, the light-emitting element PX1 may have a convex surface S1 outward. In this case, the light-emitting element PX1 may easily emit light, and the emitted light may be widely dispersed.

In some embodiments, the light-emitting element PX2 may have a concave surface S2 outward. In this case, straightness of light emitted by the light-emitting element PX2 may be improved.

In some embodiments, the light-emitting element PX3 may have a rough surface S3. In this case, light emitted by the light-emitting element PX3 may be scattered but advantageous in light extraction. The surface S3 may be regularly or irregularly roughened.

Figure 12:
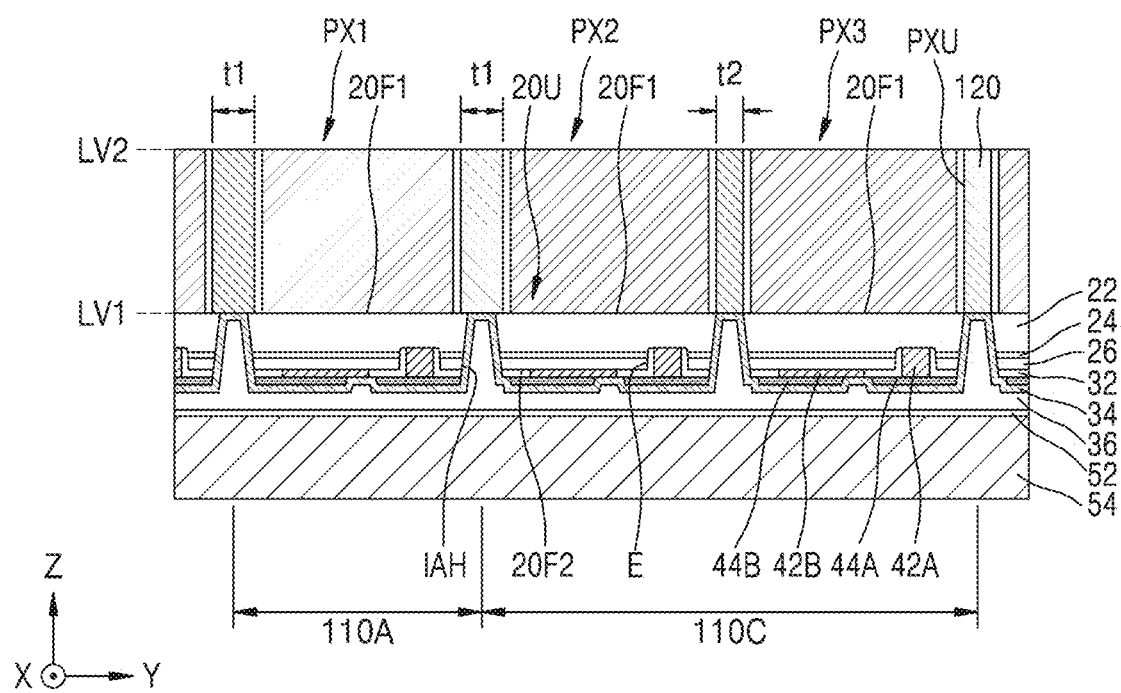
FIG. 12 is a cross-sectional view of a portion of a light-emitting device in which partition walls have various thicknesses, according to some example embodiments.

FIG. 12 is a cross-sectional view of a portion of a light-emitting device in which partition walls have various thicknesses, according to some example embodiments.

Referring to FIG. 12, a thickness t1 of a partition wall surrounding a light-emitting element PX1 may be greater than a thickness t2 of another partition wall. The partition wall having the thickness t1 greater than the thickness t2 may be mainly provided to surround emission regions positioned at an outermost portion of the light-emitting device. The emission regions positioned at the outermost portion of the light-emitting device may be surrounded by the relatively thick partition wall to ensure improved structural stability.

In the light-emitting device according to some example embodiments, the emission regions may be optimized according to given purposes and reduce manufacturing costs and operating energy.

Figure 13:
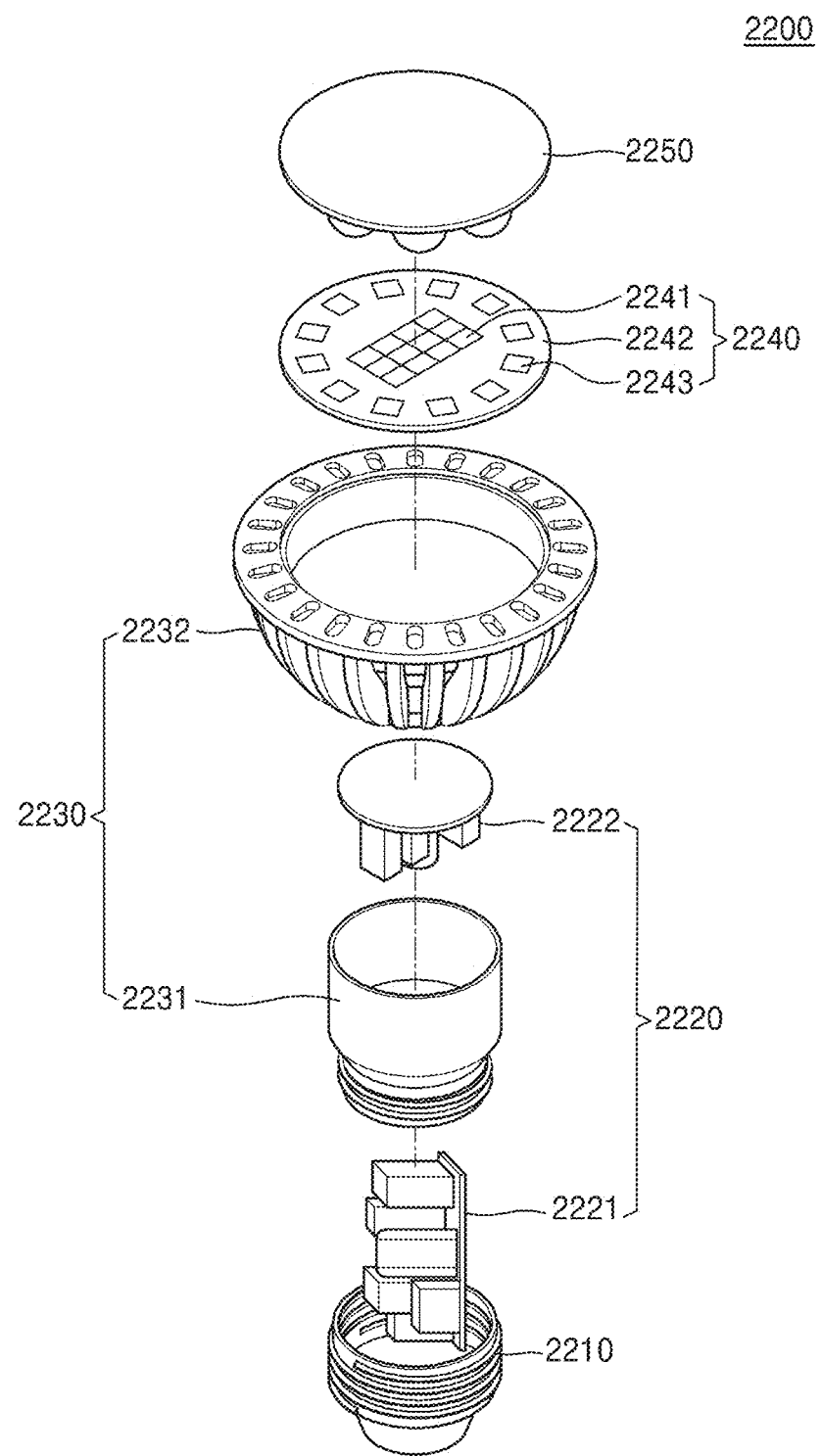
FIG. 13 is an exploded perspective view of a lighting apparatus including a light-emitting device according to some example embodiments.

FIG. 13 is an exploded perspective view of a lighting apparatus 2200 including a light-emitting device according to some example embodiments.

Referring to FIG. 13, the lighting apparatus 2200 may include a socket 2210, a power supply 2220, a heat sink 2230, a light source module 2240, and an optical unit 2250. According to some example embodiments, the light source module 2240 may include a light-emitting element array, and the power supply 2220 may include a light-emitting element driver.

The socket 2210 may be configured to be replaceable with an existing lighting apparatus. Power may be supplied to the lighting apparatus 2200 through the socket 2210. As shown in FIG. 13, the power supply 2220 may be dissembled into a first power supply 2221 and a second power supply 2222. The heat sink 2230 may include an internal heat sink 2231 and an external heat sink 2232. The internal heat sink 2231 may be directly connected to the light source module 2240 and/or the power supply 2220 and transmit heat to the external heat sink 2232. The optical unit 2250 may include an internal optical unit (not shown) and an external optical unit (not shown). The optical unit 2250 may be configured to uniformly disperse light emitted by the light source module 2240.

The light source module 2240 may receive power from the power supply 2220 and emit light to the optical unit 2250. The light source module 2240 may include one or more light-emitting device packages 2241, a circuit board 2242, and a controller 2243. The controller 2243 may store driving information of the light-emitting device packages 2241. The light-emitting device packages 2241 may include at least one of the light-emitting devices 10, 10A, and 10B described above.

Figure 14:
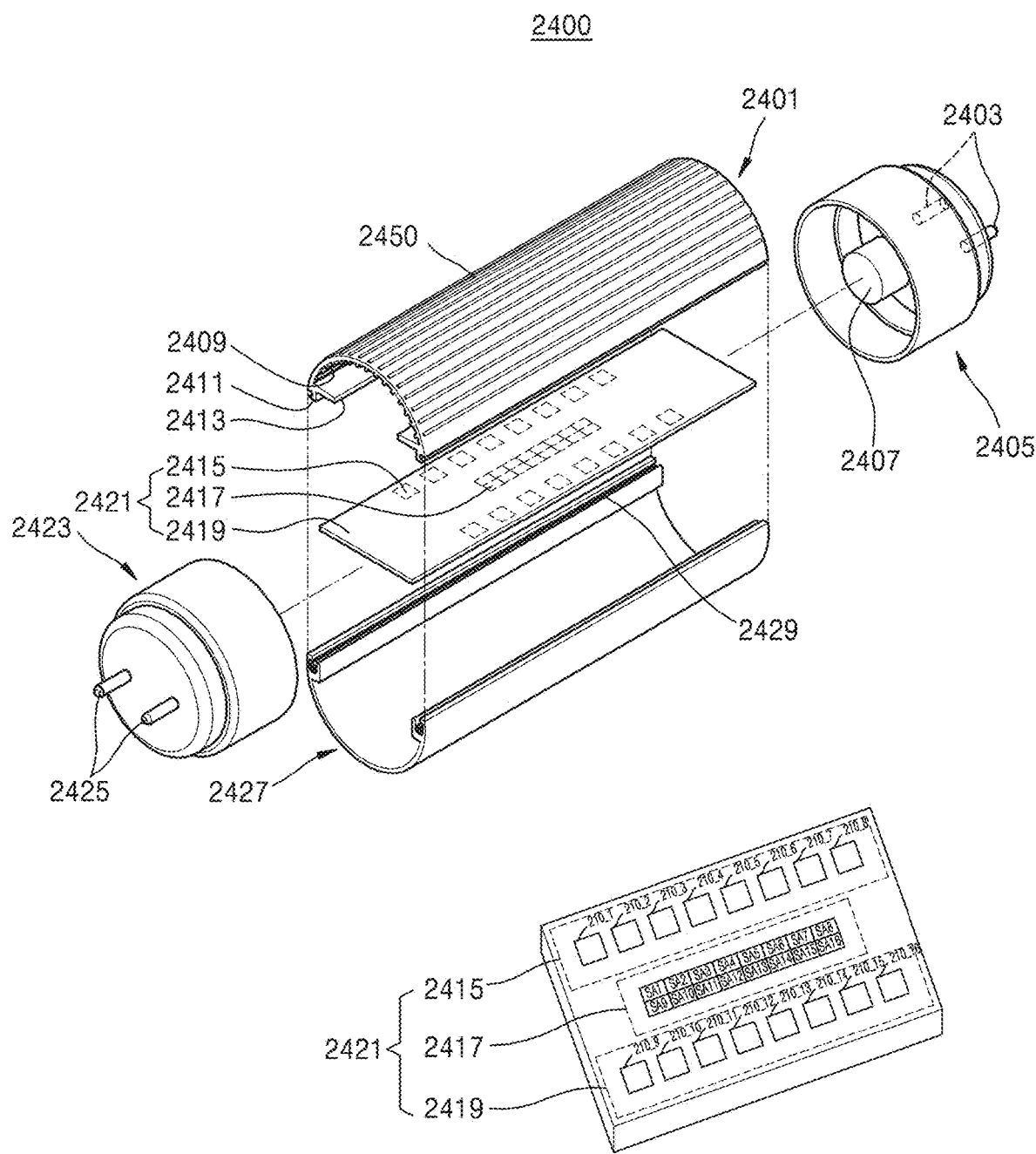
FIG. 14 is an exploded perspective view of a bar-type lighting apparatus including a light-emitting device according to some example embodiments.

FIG. 14 is an exploded perspective view of a bar-type lighting apparatus 2400 including a light-emitting device according to some example embodiments.

Referring to FIG. 14, the bar-type lighting apparatus 2400 may include a heat sink member 2401, a cover 2427, a light source module 2421, a first socket 2405, and a second socket 2423. A plurality of heat sink fins 2450 and 2409 having a concave/convex shape may be formed on inner or/and outer surfaces of the heat sink member 2401. The heat sink fins 2450 and 2409 may be designed to have various shapes and intervals. A support 2413 having a protruding shape may be formed inside the heat sink member 2401. The light source module 2421 may be fixed to the support 2413. Locking protrusions 2411 may be formed on both ends of the heat sink member 2401.

Locking grooves 2429 may be formed in the cover 2427. The locking protrusions 2411 of the heat sink member 2401 may be hooked to the locking grooves 2429. The positions of the locking grooves 2429 may be exchanged with the positions of the locking protrusions 2411.

The light source module 2421 may include a light-emitting device array. The light source module 2421 may include a printed circuit board (PCB) 2419, a light source 2417, and a controller 2415. The controller 2415 may store driving information of the light source 2417. Circuit wirings may be formed on the PCB 2419 so as to operate the light source 2417. In addition, the light source module 2421 may include components for operating the light source 2417. The light source 2417 may include at least one of the light-emitting devices 10, 10A, and 10B described above.

The first and second sockets 2405 and 2423 may be provided as a pair of sockets and may be connected to both ends of a cylindrical cover unit including the heat sink member 2401 and the cover 2427. For example, the first socket 2405 may include an electrode terminal 2403 and a power supply 2407, and the second socket 2423 may include a dummy terminal 2425. In addition, an optical sensor module and/or a communication module may be embedded into the first socket 2405 or the second socket 2423. For example, the optical sensor module and/or the communication module may be embedded into the second socket 2423 including the dummy terminal 2425. In another example, the optical sensor module and/or the communication module may be embedded into the first socket 2405 including the electrode terminal 2403.

Figure 15:
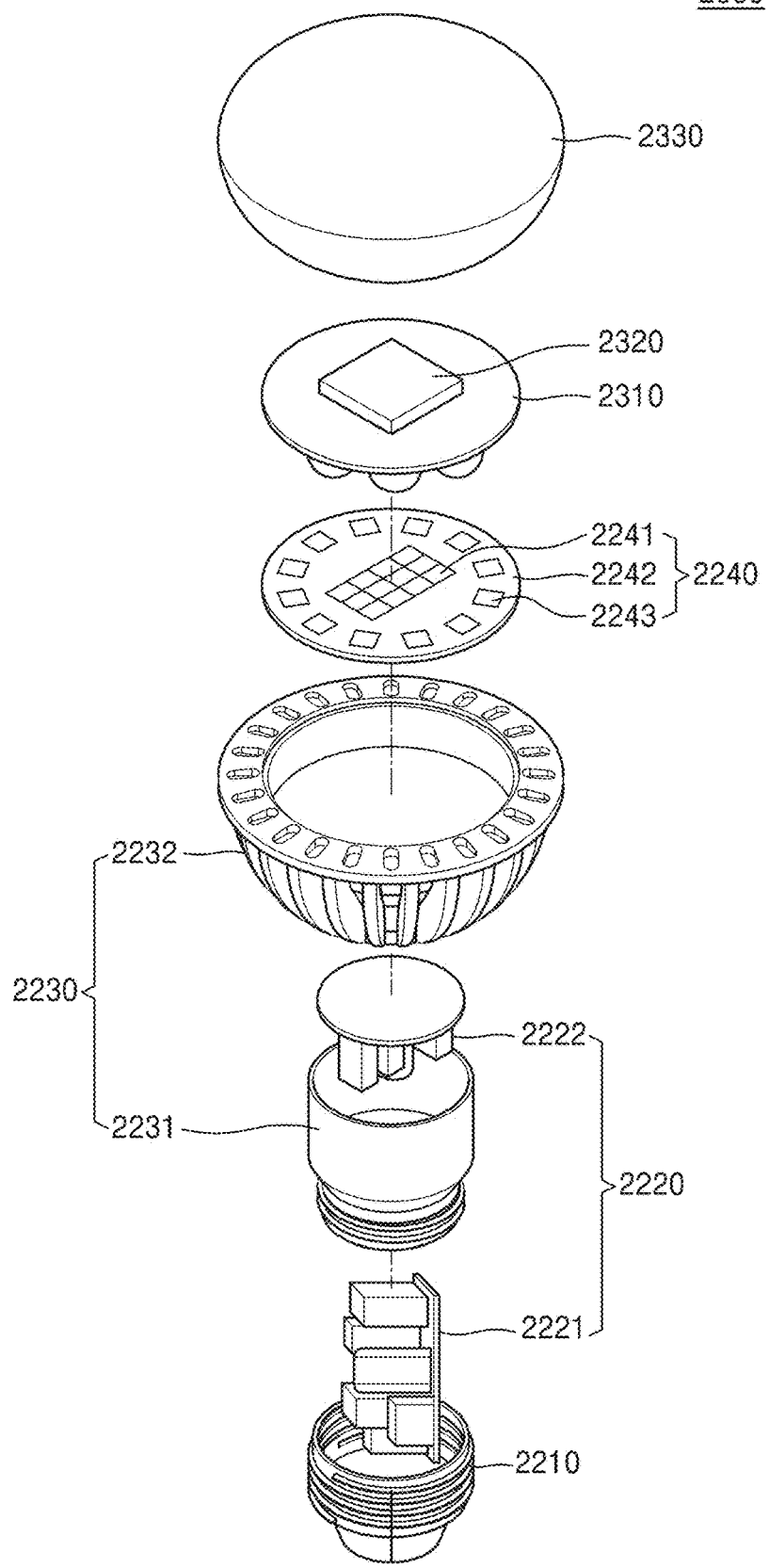
FIG. 15 is an exploded perspective view of a lighting apparatus including a light-emitting device according to some example embodiments.

FIG. 15 is an exploded perspective view of a lighting apparatus 2500 including a light-emitting device according to some example embodiments.

The lighting apparatus 2500 of FIG. 15 differs from the lighting apparatus 2200 of FIG. 13 in that a reflection plate 2310 and a communication module 2320 are provided on a light source module 2240. The reflection plate 2310 may uniformly disperse light from the light source in a lateral direction and a rearward direction so as to reduce glare.

The communication module 2320 may be mounted on the reflection plate 2310, and home network communication may be performed through the communication module 2320. For example, the communication module 2320 may be a wireless communication module using ZigBee, WiFi, or LiFi, and may control an indoor or outdoor lighting apparatus, such as on/off operations or brightness adjustment of the lighting apparatus through a smartphone or a wireless controller. Also, the communication module 2320 may control indoor or outdoor electronic appliances and vehicle systems, such as TVs, refrigerators, air conditioners, door lock systems, and vehicles, through a LiFi communication module using visible light wavelength of the indoor or outdoor lighting apparatus. The reflection plate 2310 and the communication module 2320 may be covered by a cover 2330.

Figure 16:
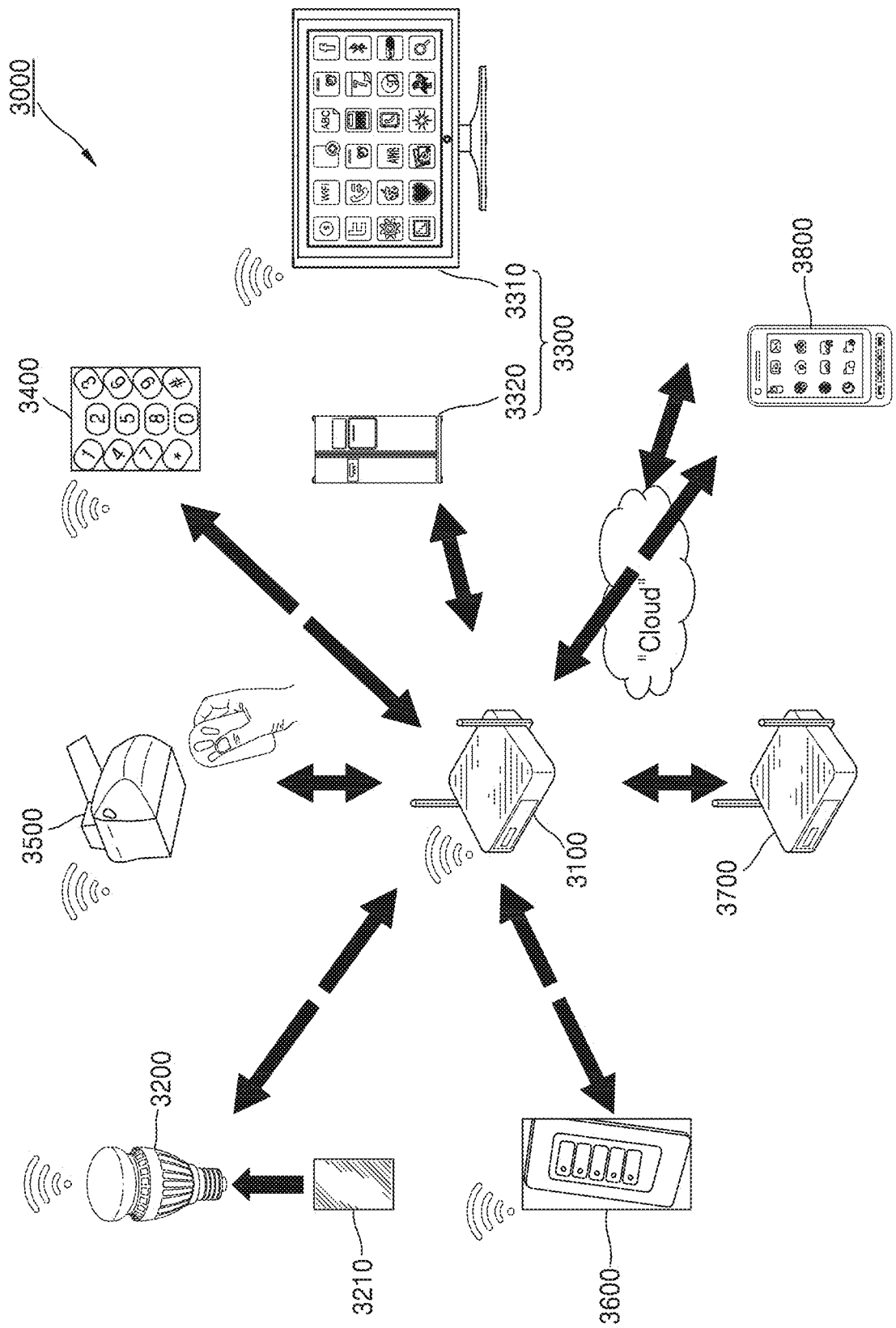
FIG. 16 is a diagram for describing an indoor lighting control network system including a light-emitting device according to some example embodiments.

FIG. 16 is a diagram for describing an indoor lighting control network system 3000 including a light-emitting device according to some example embodiments.

Specifically, the indoor lighting control network system (hereinafter, referred to as network system) 3000 may be a composite smart lighting-network system in which illumination technology using a light-emitting device, such as a light-emitting diode (LED), Internet of Things (IoT) technology, wireless communication technology converge. The network system 3000 may be implemented using various lighting apparatuses and wired/wireless communication devices. The network system 3000 may be implemented by a sensor, a controller, a communication unit, and software for network control and maintenance.

The network system 3000 may be applied not only to closed spaces defined in a building, such as homes or offices, but also to open spaces such as parks or streets. The network system 3000 may be implemented based on an IoT environment so as to collect, process, and provide a variety of information to users.

An LED lamp 3200 included in the network system 3000 may receive information about an ambient environment from a gateway 3100 and control illumination of the LED lamp 3200 itself. Furthermore, the LED lamp 3200 may check and control the operation states of other devices (e.g., 3300 to 3800) included in the IoT environment based on a visible light communication function of the LED lamp 3200. The LED lamp 3200 may include at least one of the light-emitting devices 10, 10A, and 10B described above.

The network system 3000 may include a gateway 3100 configured to process transceived data according to different communication protocols, an LED lamp 3200 communicably connected to the gateway 3100 and including an LED, and a plurality of devices (e.g., 3300 to 3800) communicably connected to the gateway 3100 according to various wireless communication methods. Each of the LED lamp 3200 and the devices (e.g., 3300 to 3800) may include at least one communication module. The LED lamp 3200 may be communicably connected to the gateway 3100 by the wireless communication protocol such as WiFi, ZigBee, or LiFi. To this end, the LED lamp 3200 may include at least one lamp communication module 3210.

In a case where the network system 3000 is applied to the home, the plurality of devices (e.g., 3300 to 3800) may include electronic appliances 3300 (e.g., TV 3310 and/or refrigerator 3320), a digital door lock 3400, a garage door lock 3500, a lighting switch 3600 installed on a wall, a router 3700 for relaying a wireless communication network, and mobile devices 3800 such as smartphones, tablets, or laptop computers.

In the network system 3000, the LED lamp 3200 may check operation states of the various devices (e.g., 3300 to 3800) or automatically control the illumination of the LED lamp 3200 itself according to the ambient environment and conditions by using the wireless communication network (e.g., ZigBee, WiFi, LiFi, etc.) installed at home. In addition, the LED lamp 3200 may control the devices (e.g., 3300 to 3800) included in the network system 3000 through LiFi communication using visible light emitted by the LED lamp 3200.

Initially, the LED lamp 3200 may automatically control the illumination of the LED lamp 3200 based on the information about the ambient environment, which is transmitted from the gateway 3100 through the lamp communication module 3210, or the information about the ambient environment, which is collected from a sensor mounted on the LED lamp 3200. For example, the brightness of the LED lamp 3200 may be automatically adjusted according to a kind of a TV program aired on the TV 3310 or a screen brightness of the TV 3310. To this end, the LED lamp 3200 may receive operation information of the TV 3310 from the lamp communication module 3210 connected to the gateway 3100. The lamp communication module 3210 may be integrally modularized with a sensor and/or a controller included in the LED lamp 3200.

For example, after elapse of a particular (or, alternatively, predetermined) time after the digital door lock 3400 has been locked in such a state that there is no person at home, it is possible to prevent waste of electricity by turning off the turned-on LED lamp 3200. Alternatively, in a case where a security mode is set through the mobile device 3800 or the like, when the digital door lock 3400 is locked in such a state that there is no person at home, the LED lamp 3200 may maintain the turned-on state.

The operation of the LED lamp 3200 may be controlled according to information about the ambient environment, which is collected through various sensors connected to the network system 3000. For example, in a case where the network system 3000 is implemented in a building, it is possible to turn on or off the illumination by combining a lighting apparatus, a position sensor, and a communication module within the building, or provide collected information in real time, thus enabling efficient facility management or efficient utilization of unused space. Since a lighting apparatus, such as the LED lamp 3200, is generally positioned in almost all spaces of each floor in a building, various information in the building may be collected using a sensor integrally provided with the LED lamp 3200, and used for facility management or utilization of unused space.

Figure 17:
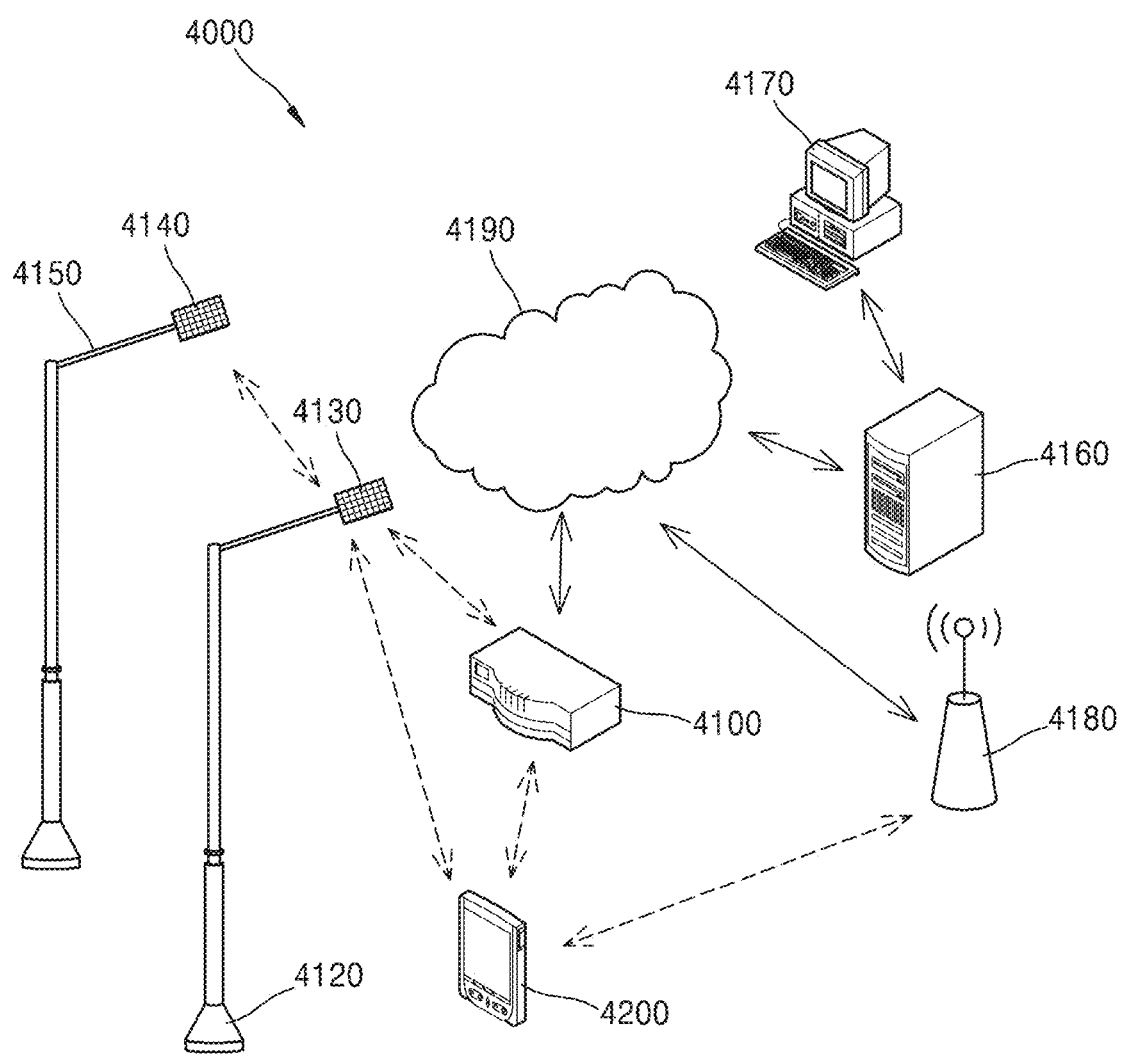
FIG. 17 is a diagram for describing a network system including a light-emitting device according to some example embodiments.

FIG. 17 is a diagram for describing a network system 4000 including a light-emitting device according to some example embodiments.

Specifically, FIG. 17 illustrates the network system 4000 applied to an open space, according to some example embodiments. The network system 4000 may include a communication connecting device 4100, a plurality of lighting apparatuses 4120 and 4150 installed at particular (or, alternatively, predetermined) intervals and communicably connected to the communication connecting device 4100, a server 4160, a computer 4170 configured to manage the server 4160, a communication base station 4180, a communication network 4190 configured to connect communicable devices, and a mobile device 4200.

The plurality of lighting apparatuses 4120 and 4150 installed in open external spaces such as streets or parks may include smart engines 4130 and 4140, respectively. Each of the smart engines 4130 and 4140 may include a light-emitting device configured to emit light, a driver configured to drive the light-emitting device, a sensor configured to collect information about an ambient environment, and a communication module. The light-emitting device included in the smart engine 4130 and 4140 may include at least one of the light-emitting devices 10, 10A, and 10B described above.

The communication module may enable the smart engines 4130 and 4140 to communicate with other peripheral devices in accordance with a communication protocol such as WiFi, ZigBee, or LiFi. One smart engine 4130 may be communicably connected to the other smart engine 4140. In this case, a WiFi mesh may be applied to the communication between the smart engines 4130 and 4140. At least one smart engine 4130 may be connected to the communication connecting device 4100 connected to the communication network 4190 by a wired/wireless communication.

The communication connecting device 4100 may be an access point (AP) capable of performing wired/wireless communications and may relay a communication between the communication network 4190 and other devices. The communication connecting device 4100 may be connected to the communication network 4190 by at least one of the wired/wireless communication schemes. For example, the communication connecting device 4100 may be mechanically accommodated in one of the lighting apparatuses 4120 and 4150.

The communication connecting device 4100 may be connected to the mobile device 4200 through a communication protocol such as WiFi. A user of the mobile device 4200 may receive information about the ambient environment, which is collected by the plurality of smart engines 4130 and 4140, through a communication connecting device connected to the smart engine 4130 of an adjacent lighting apparatus 4120. The information about the ambient environment may include neighboring traffic information, weather information, and the like. The mobile device 4200 may be connected to the communication network 4190 through the communication base station 4180 by a wireless cellular communication scheme such as a 3G or 4G communication scheme.

The server 4160 connected to the communication network 4190 may receive information collected by the smart engines 4130 and 4140 respectively mounted on the lighting apparatuses 4120 and 4150 and may monitor the operation states of the lighting apparatuses 4120 and 4150. The server 4160 may be connected to the computer 4170 that provides a management system, and the computer 4170 may execute software capable of monitoring and managing the operation states of the smart engines 4130 and 4140.

FIGS. 19A to 19J are cross-sectional views illustrating a method of manufacturing a light-emitting device according to a process sequence, according to some example embodiments. In FIGS. 19A to 19J, the same reference numerals are used to denote the same elements as in FIG. 2.

Figure 19A:
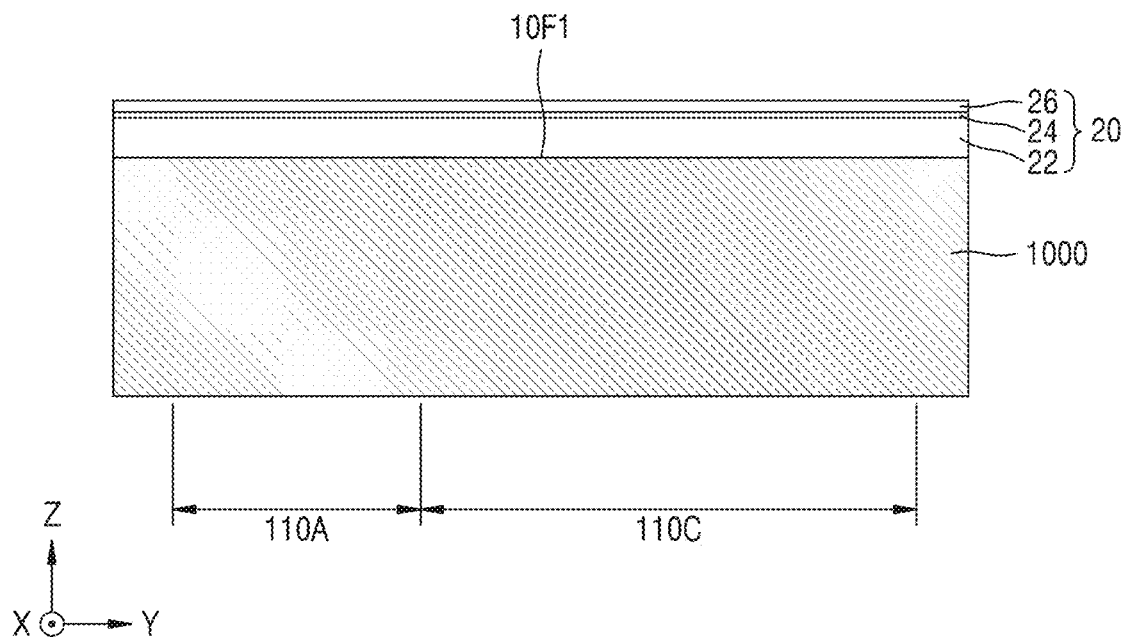
FIGS. 19A to 19J are cross-sectional views illustrating a method of manufacturing a light-emitting device according to a process sequence, according to some example embodiments.

Referring to FIG. 19A, a light-emitting stack 20 may be formed on a substrate 1000. In example embodiments, the substrate 1000 may include a silicon (Si) substrate, a silicon carbide (SiC) substrate, a sapphire substrate, a gallium nitride (GaN) substrate, or the like. The substrate 1000 may include a first region 110A and a third region 110C.

The light-emitting stack 20 may include a first conductive semiconductor layer 22, an active layer 24, and a second conductive semiconductor layer 26, which are sequentially formed on a first surface 10F1 of the substrate 1000.

Figure 19B:
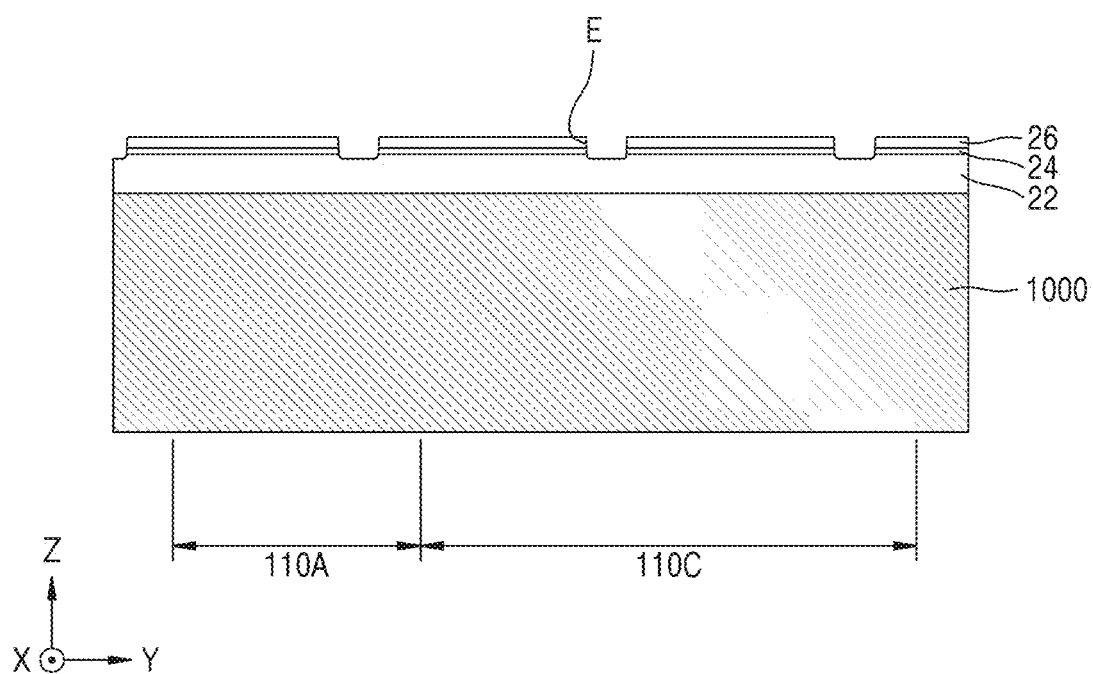

Referring to FIG. 19B, a mask pattern (not shown) may be formed on the light-emitting stack 20, and a portion of the light-emitting stack 20 may be removed using the mask pattern as an etching mask and thus an opening E may be formed. The opening E may expose an upper surface of the first conductive semiconductor layer 22. The opening E may expose the first conductive semiconductor layer 22.

Figure 19C:
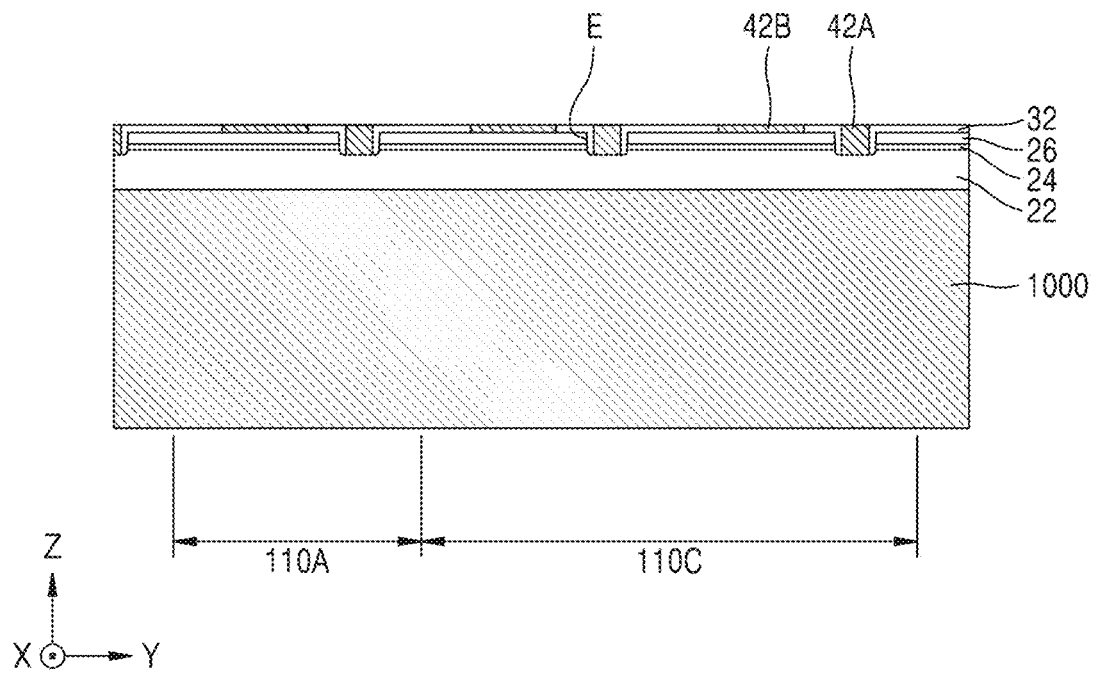

Referring to FIG. 19C, a first insulating layer 32 may be formed on the light-emitting stack 20 to conformally cover the opening E. The first insulating layer 32 may be formed on both the first region 110A and the third region 110C.

Thereafter, a portion of the first insulating layer 32 in the opening E may be removed and a portion of the first insulating layer 32 on the second conductive semiconductor layer 26 may be removed to thereby expose an upper surface of the first conductive semiconductor layer 22 and an upper surface of the second conductive semiconductor layer 26.

A first electrode 42A and a second electrode 42B may be formed on the exposed upper surface of the first conductive semiconductor layer 22 and the exposed upper surface of the second conductive semiconductor layer 26, respectively. A first contact layer (not shown) including a conductive ohmic material may be further formed between the first electrode 42A and the first conductive semiconductor layer 22, and a second contact layer (not shown) including a conductive ohmic material may be further formed between the second electrode 42B and the second conductive semiconductor layer 26.

Figure 19D:
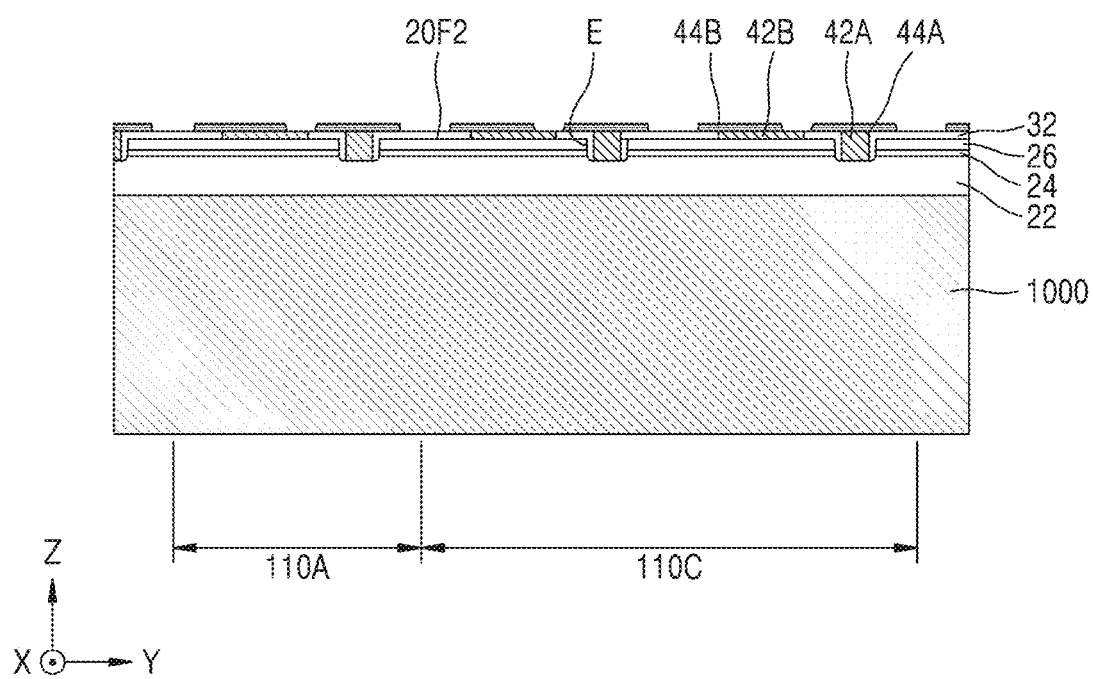

Referring to FIG. 19D, a first connection electrode 44A and a second connection electrode 44B electrically connected to the first electrode 42A and the second electrode 42B, respectively may be formed on a first insulating layer 32. In example embodiments, a conductive layer (not shown) may be formed on the first electrode 42A, the second electrode 42B, and the first insulating layer 32, and the conductive layer may be patterned to thereby form the first connection electrode 44A and the second connection electrode 44B connected to the first electrode 42A and the second electrode 42B, respectively. In other embodiments, the first connection electrode 44A and the second connection electrode 44B may be formed by a plating process.

Figure 19E:
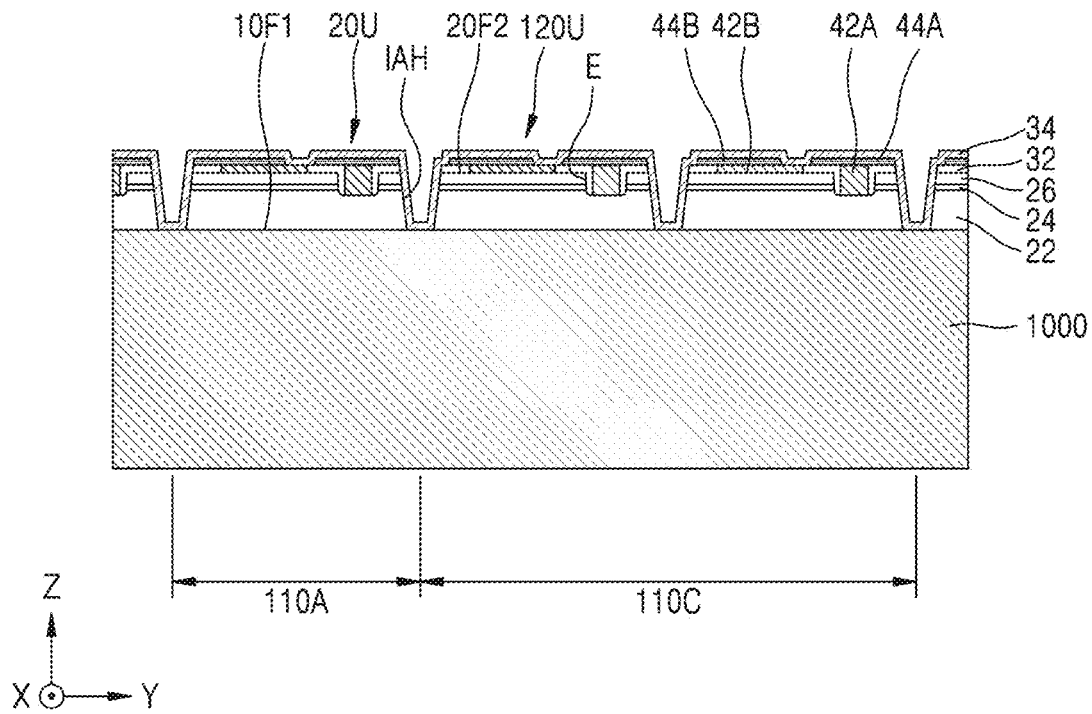

Referring to FIG. 19E, a portion of the light-emitting stack 20 may be removed and thus a device isolation opening IAH may be formed in the light-emitting stack 20 in the first region 110A and the third region 110C, respectively. The device isolation opening IAH may completely pass through the light-emitting stack 20, and thus, the first surface 10F1 of the substrate 1000 may be exposed at the bottom of the device isolation opening IAH.

In the first region 110A and the third region 110C, the light-emitting stack 20 may be separated into a plurality of light-emitting element structures 20U by the device isolation opening IAH.

In example embodiments, a process of forming the device isolation opening IAH may be performed by a blade, but is not limited thereto. As shown in FIG. 19E, a cross-sectional shape of each of the plurality of light-emitting element structures 20U obtained by the process of forming the device isolation opening IAH may be a trapezoid shape whose upper width is different from a lower width thereof. However, the inventive concepts is not limited thereto.

Thereafter, an insulating liner 34 may be formed on the upper surfaces and sidewalls of the plurality of light-emitting element structures 20U and the light-emitting stack 20. The insulating liner 34 may be conformally formed on the inner wall of the device isolation opening IAH, and may contact the first surface 10F1 of the substrate 1000 exposed at the bottom of the device isolation opening IAH.

As one light-emitting element structure 20U is physically and electrically separated from an adjacent light-emitting element structure 120U by the device isolation opening IAH and the insulating liner 34, light emitted from the light-emitting element structure 20U may not be absorbed or penetrated into an adjacent light-emitting element structure 20U, and accordingly, contrast characteristics of light-emitting elements may be improved.

Thereafter, although not shown in FIG. 19E, a portion of the insulating liner 34 may be removed to expose the upper surfaces of the first connection electrode 44A and the second connection electrode 44B, and wiring patterns (not shown) for electrical connection may be formed.

Figure 19F:
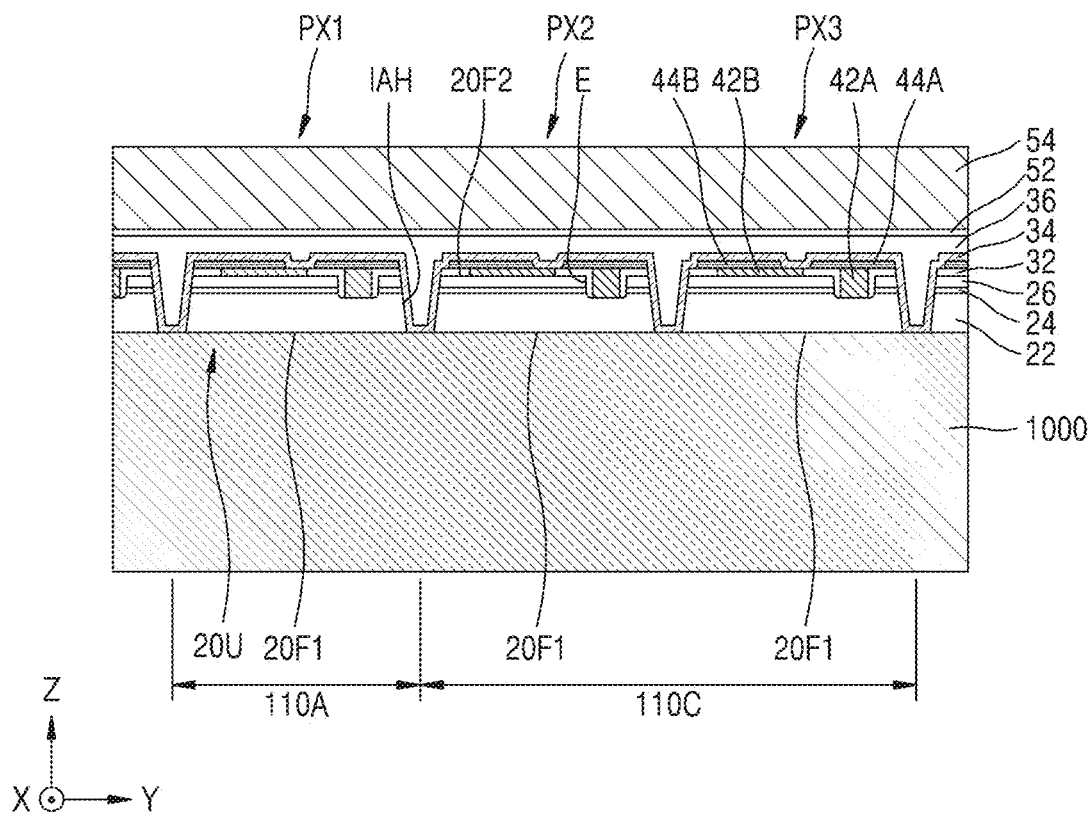

Referring to FIG. 19F, a buried insulating layer 36 may be formed on the insulating liner 34 and the wiring patterns. The buried insulating layer 36 may fill the remaining space of the device isolation opening IAH.

Thereafter, an adhesive layer 52 may be formed on the buried insulating layer 36 and a support substrate 54 may be attached onto the adhesive layer 52.

Figure 19G:
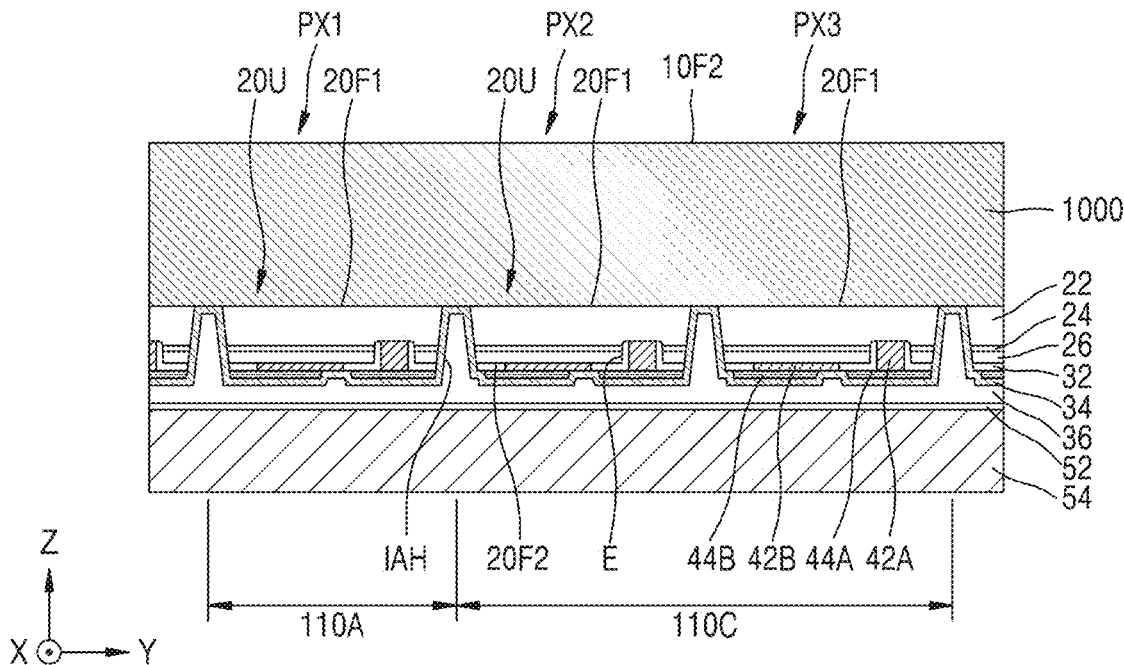

Referring to FIG. 19G, the light-emitting stack 20 attached to the support substrate 54 may be reversed such that a second surface 10F2 opposite the first surface 10F1 of the substrate 1000 faces upward. Then, an upper portion of the substrate 1000 may be removed from the second surface 10F2 of the substrate 1000 by a grinding process, and thus, a level of the second surface 10F2 of the substrate 1000 may be lowered.

Figure 19H:
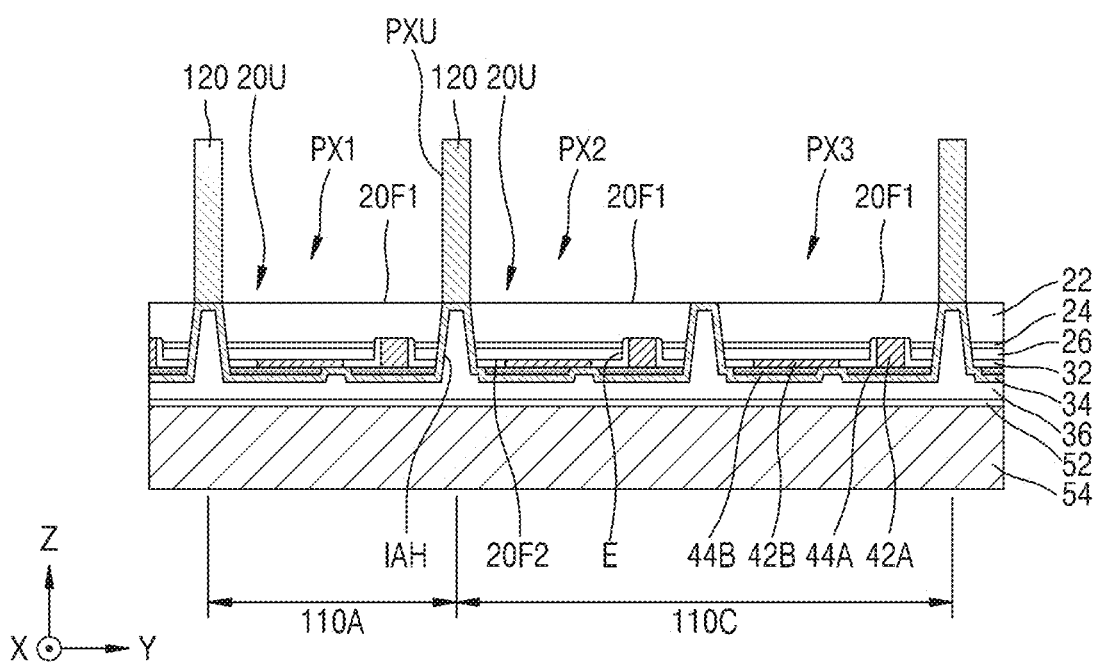

Referring to FIG. 19H, a mask pattern (not shown) may be formed on the second surface 10F2 of the substrate 1000, and a portion of the substrate 1000 may be removed using the mask pattern as an etching mask and thus a plurality of pixel spaces PXU may be formed in the first region 110A and the third region 110C of the substrate 1000, where each pixel space PXU may be an open enclosure that is at least partially defined by one or more light-emitting elements PX1 to PX3 and one or more partition walls 120. A portion of the substrate 1000 remaining between the plurality of pixel spaces PXU in the first region 110A and the third region 110C may be referred to as a first partition wall layer 120.

The first partition wall layer 120 may be positioned to vertically overlap the device isolation opening IAH, and a plurality of light-emitting element structures 20U may be respectively positioned in the plurality of pixel spaces PXU. At the bottoms of the plurality of pixel spaces PXU, the upper surface of the first conductive semiconductor layer 22, that is, the first surface 20F1 of the plurality of light-emitting element structures 20U, may be exposed.

Figure 19I:
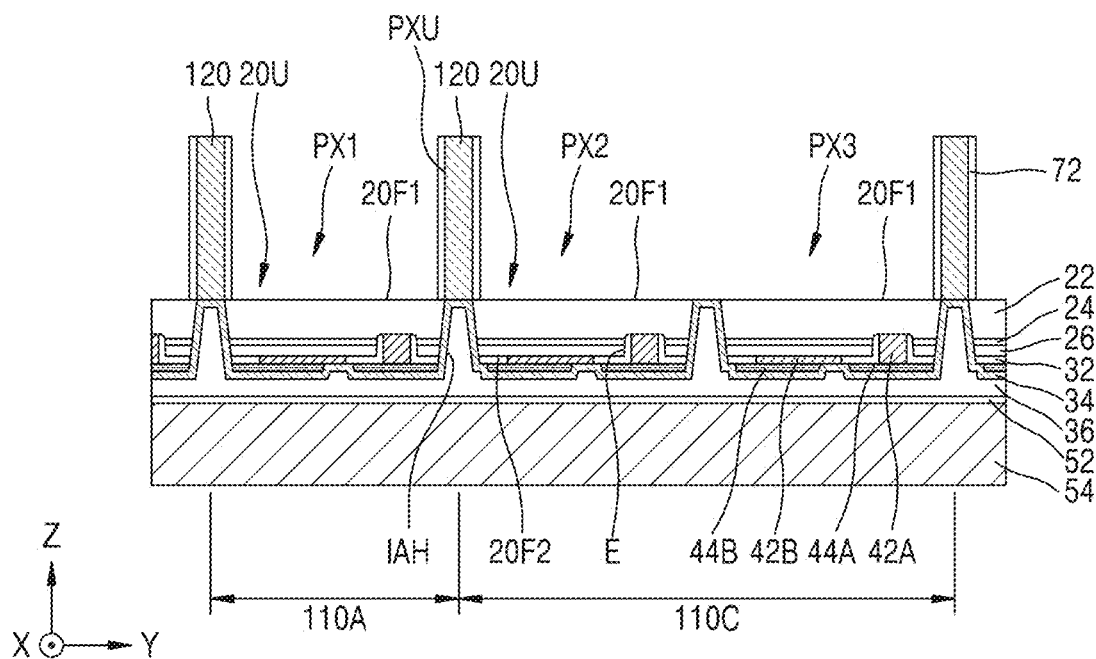

Referring to FIG. 19I, a conductive layer (not shown) may be formed on the upper surface of the substrate 1000 and on inner walls of the plurality of pixel spaces PXU, and an anisotropic etching process may be performed on the conductive layer to thereby form a reflective layer 72 on the sidewalls of the plurality of pixel spaces PXU (or the sidewall of the first partition wall layer 120).

Figure 19J:
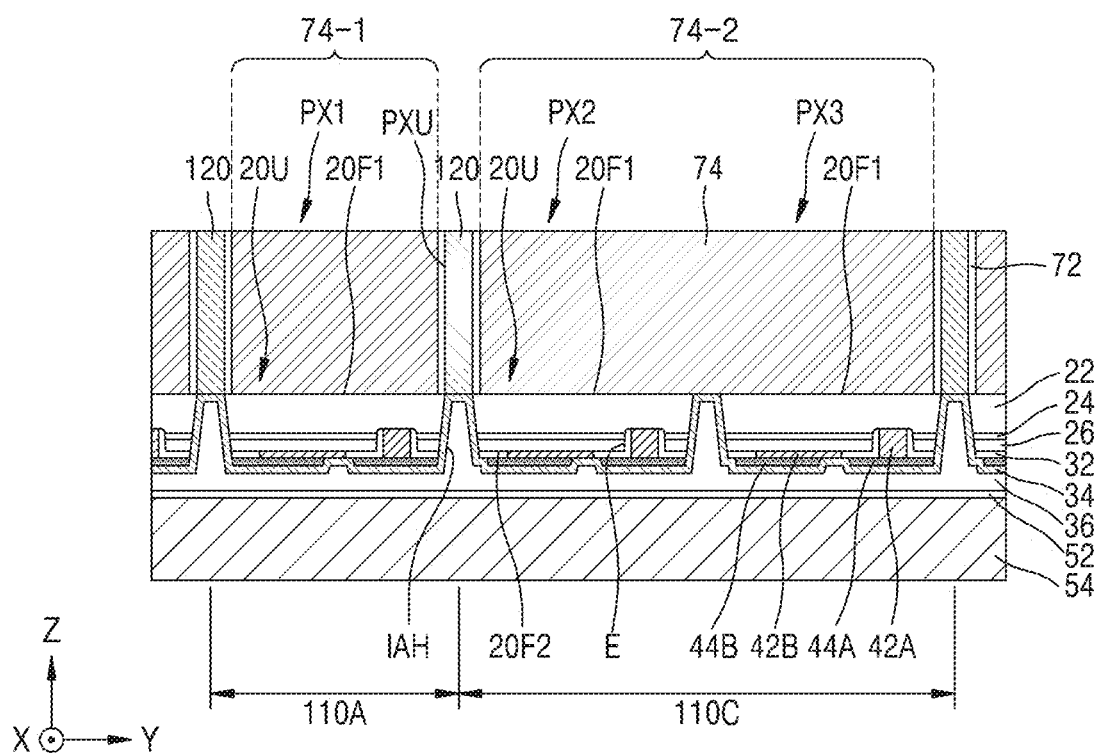

Referring to FIG. 19J, a fluorescent layer 74 may be formed to fill the plurality of pixel spaces PXU, such that the fluorescent layer 74 includes separate portions that are in separate regions (e.g., as shown in FIG. 19J, a first portion 74-1 of the fluorescent layer 74 in a first open enclosure defined by a first light-emitting element PX1 and one or more partition walls 120 and a second portion 74-2 of the fluorescent layer 74 in a second open enclosure defined by light-emitting elements PX2 and PX3 and the one or more partition walls 120).

In example embodiments, the fluorescent layer 74 may be formed by applying or dispensing a resin containing fluorescent material particles dispersed therein into the plurality of pixel spaces PXU, such that the fluorescent layer 74 fills the plurality of pixel spaces PXU at least partially defined by the one or more partition walls 120 and the plurality of light-emitting elements PX1 to PX3. The fluorescent layer 74 may include two or more kinds of fluorescent material particles having different size distributions so that the fluorescent material particles may be uniformly dispersed in each of the plurality of pixel spaces PXU.

Typical example embodiments of the inventive concepts are disclosed in the above description and the drawings. Although specific terms are employed, they are used in a generic and descriptive sense only and not for purposes of limitation. It will be understood by those of ordinary skill in the art that various changes in form and details may be made to the disclosed embodiments without departing from the spirit and scope of the inventive concepts as defined by the following claims.

What is claimed is:

1. A light-emitting device, comprising:
a support substrate;
an adhesive layer on the support substrate;
an insulating layer on the adhesive layer;
a plurality of light-emitting elements in the insulating layer, wherein the plurality of light-emitting elements are separated by a device isolation opening and the device isolation opening is filled with the insulating layer, and each of the plurality of light-emitting elements sequentially includes a first conductive semiconductor layer, an active layer, a second conductive semiconductor layer, a first electrode connected to the first conductive semiconductor layer, and a second electrode connected to the second conductive semiconductor layer, the first electrode penetrating the active layer and the second conductive semiconductor layer;
an emission array, the emission array including the plurality of light-emitting elements, the emission array including a first region and a second region, the first region and the second region adjacent to each other; and
a partition wall configured to at least partially isolate the first region and the second region from each other, such that the partition wall at least partially defines the first region in the emission array, wherein a lower surface of the partition wall is coplanar with an upper surface of the first conductive semiconductor layer,
wherein the first region includes a single light-emitting element and the second region includes two or more light-emitting elements,
wherein the first region is associated with a first emission factor and the second region is associated with a second emission factor, the second emission factor different from the first emission factor,
wherein the first emission factor is a planar area of the first region, and the second emission factor is a planar area of the second region, and
wherein the planar area of the second region is greater than the planar area of the first region.

2. The light-emitting device of claim 1, wherein
the first region is configured to be driven in response to a first driving signal, and
the second region is configured to be driven in response to a second driving signal, the second driving signal is separate from the first driving signal.

3. The light-emitting device of claim 2, wherein
the first emission factor further includes a first voltage of power that the light-emitting device is configured to supply to the first region and the second emission factor further includes a second voltage of power that the light-emitting device is configured to supply to the second region, and
the second voltage is greater than the first voltage.

4. The light-emitting device of claim 1, wherein
each region of the first region and the second region are defined by encompassing the first region and the second region with the partition wall and there is no partition wall inside the first region and the second region.

5. The light-emitting device of claim 1, wherein
the partition wall includes silicon (Si), silicon carbide (SiC), sapphire, and/or gallium nitride (GaN).

6. The light-emitting device of claim 1, wherein
the partition wall includes a plurality of partition walls, one partition wall having a different height, thickness, or height and thickness in relation to a remaining partition wall of the plurality of partition walls.

7. The light-emitting device of claim 6, wherein
the one partition wall contributes to a difference in emission factor between the first region and the second region.

8. The light-emitting device of claim 1, wherein
the first region and the second region each include a fluorescent layer directly on the first conductive semiconductor layer,
the first emission factor further comprises a light emission characteristic of the first region and the second emission factor further comprises a light emission characteristic of the second region,
the light emission characteristic of the first region includes a luminance of light emitted by the first region, an orientation angle of light emitted by the first region, contrast of light emitted by the first region, a surface shape associated with light emitted by the first region, a sub-combination thereof, or a combination thereof, and
the light emission characteristic of the second region includes a luminance of light emitted by the second region, an orientation angle of light emitted by the second region, contrast of light emitted by the second region, a surface shape associated with light emitted by the second region, a sub-combination thereof, or a combination thereof.

9. The light-emitting device of claim 1, wherein
a number of first electrodes of the plurality of light-emitting elements in the second region is greater than a number of first electrodes of the plurality of light-emitting elements in the first region.

10. A light-emitting device, comprising:
a support substrate;
an adhesive layer on the support substrate;
an insulating layer on the adhesive layer;

a plurality of light-emitting elements in the insulating layer, wherein the plurality of light-emitting elements are separated by a device isolation opening and the device isolation opening is filled with the insulating layer, and each of the plurality of light-emitting elements sequentially includes a first conductive semiconductor layer, an active layer, a second conductive semiconductor layer, a first electrode connected to the first conductive semiconductor layer, and a second electrode connected to the second conductive semiconductor layer, the first electrode penetrating the active layer and the second conductive semiconductor layer;

an emission array, the emission array including the plurality of light-emitting elements, the emission array including a first region and a second region, the first region and the second region adjacent to each other; and a partition wall configured to at least partially isolate the first region and the second region from each other, such that the partition wall at least partially defines the first region in the emission array, wherein a lower surface of the partition wall is coplanar with an upper surface of the first conductive semiconductor layer, wherein a number of first electrodes of the plurality of light-emitting elements in the second region is greater than a number of first electrodes of the plurality of light-emitting elements in the first region.

11. The light-emitting device of claim 10, wherein the second region includes a gradation area, and
a planar area of the gradation area is between about 50% to about 90% of the planar area of the second region.

12. The light-emitting device of claim 10, wherein the light-emitting device includes a high-beam zone and a low-beam zone, the high-beam zone and the low-beam zone configured to be driven according to separate, respective driving signals having different electrical characteristics, and
the high-beam zone includes at least one emission region of the emission array, the at least one emission region having a polygonal plane shape having at least one interior angle other than 90°.

13. The light-emitting device of claim 12, further comprising a corner zone, the corner zone including a separate plurality of light-emitting elements, wherein the corner zone extends over one side surface of the high-beam zone and one side surface of the low-beam zone.

14. The light-emitting device of claim 13, wherein an average area of the light-emitting elements of the corner zone is greater than an average area of light-emitting elements of the low-beam zone.

15. The light-emitting device of claim 10, wherein the first region is configured to be driven in response to a first driving signal,
the second region is configured to be driven in response to a second driving signal that is separate from the first driving signal, and
the first driving signal is different from the second driving signal in a driving voltage, a driving current, a driving duty, a sub-combination thereof, or a combination thereof.

16. The light-emitting device of claim 10, wherein the partition wall includes a plurality of partition walls, one partition wall having a different height, thickness, or height and thickness in relation to a remaining partition wall of the plurality of partition walls.

17. The light-emitting device of claim 16, wherein the one partition wall contributes to a difference in emission factor between the first region and the second region.

18. The light-emitting device of claim 10, wherein the first region includes a single light-emitting element and the second region includes two or more light-emitting elements, and
a planar area of the second region is greater than a planar area of the first region.

19. The light-emitting device of claim 10, wherein a total planar area of the first electrodes of the plurality of light-emitting elements in the second region is greater than a total planar area of the first electrodes of the plurality of light-emitting elements in the first region.

20. A light-emitting device, comprising:
a support substrate;
an adhesive layer on the support substrate;
an insulating layer on the adhesive layer;
a plurality of light-emitting elements in the insulating layer, wherein the plurality of light-emitting elements are separated by a device isolation opening and the device isolation opening is filled with the insulating layer, and each of the plurality of light-emitting elements sequentially includes a first conductive semiconductor layer, an active layer, a second conductive semiconductor layer, a first electrode connected to the first conductive semiconductor layer, and a second electrode connected to the second conductive semiconductor layer, the first electrode penetrating the active layer and the second conductive semiconductor layer;
an emission array, the emission array including the plurality of light-emitting elements, the emission array including a first region and a second region, the first region and the second region adjacent to each other; and
a partition wall configured to at least partially isolate the first region and the second region from each other, such that the partition wall at least partially defines the first region in the emission array, wherein a lower surface of the partition wall is coplanar with an upper surface of the first conductive semiconductor layer,
wherein a total planar area of first electrodes of the plurality of light-emitting elements in the second region is greater than a total planar area of first electrodes of the plurality of light-emitting elements in the first region.

* * * * *